US011277099B2

United States Patent
Srinidhi Embar et al.

(10) Patent No.: US 11,277,099 B2
(45) Date of Patent: Mar. 15, 2022

(54) SYMMETRIC DOHERTY AMPLIFIER WITH IN-PACKAGE COMBINING NODE

(71) Applicant: NXP USA, Inc., Austin, TX (US)

(72) Inventors: Ramanujam Srinidhi Embar, Gilbert, AZ (US); Ning Zhu, Chandler, AZ (US); Muhammad Abduhu Ruhul Hasin, Chandler, AZ (US); Roy McLaren, Gilbert, AZ (US)

(73) Assignee: NXP USA, Inc., Austin, TX (US)

(*) Notice: Subject to any disclaimer, the term of this patent is extended or adjusted under 35 U.S.C. 154(b) by 1 day.

(21) Appl. No.: 16/897,488

(22) Filed: Jun. 10, 2020

(65) Prior Publication Data

US 2021/0391829 A1    Dec. 16, 2021

(51) Int. Cl.
| | |
|---|---|
| *H03F 1/07* | (2006.01) |
| *H03F 1/02* | (2006.01) |
| *H03F 3/195* | (2006.01) |
| *H03F 3/24* | (2006.01) |
| *H03F 1/56* | (2006.01) |

(52) U.S. Cl.
CPC ........... *H03F 1/0288* (2013.01); *H03F 1/565* (2013.01); *H03F 3/195* (2013.01); *H03F 3/245* (2013.01); *H03F 2200/255* (2013.01); *H03F 2200/378* (2013.01); *H03F 2200/451* (2013.01)

(58) Field of Classification Search
CPC .................................... H03F 1/07; H03F 1/02
USPC .............................................. 330/295, 124 R
See application file for complete search history.

(56) References Cited

U.S. PATENT DOCUMENTS

| | | | |
|---|---|---|---|
| 7,078,976 B2 | 7/2006 | Blednov | |
| 7,884,668 B2 | 2/2011 | Blednov | |
| 8,659,359 B2* | 2/2014 | Ladhani | ............... H03F 1/0211 330/302 |
| 9,614,479 B2 | 4/2017 | Hallberg et al. | |

(Continued)

FOREIGN PATENT DOCUMENTS

WO    WO 2008/062371 A2    5/2008

OTHER PUBLICATIONS

Hasin, Muhammad Ruhul et al.; "Optimized Load Trajectory for Finite Peaking OFF-State Impedance-Based Doherty Power Amplifiers"; IEEE Microwave and Wireless Components Letters, vol. 29, No. 7: 3 pages (Jul. 2019).

(Continued)

*Primary Examiner* — Henry Choe
(74) *Attorney, Agent, or Firm* — Sherry W Gourlay

(57) ABSTRACT

An RF power amplifier includes an amplifier device and a shunt-inductance circuit. The amplifier device includes a substrate, a combining node lead, first and second amplifier dies coupled to the substrate, and first and second output circuits. The first and second amplifier dies are configured to amplify first and second input RF signals, respectively, to produce first and second output RF signals at first and second output terminals, respectively. The first output circuit includes a first inductive path connecting the first output terminal to the lead. The second output circuit includes a second inductive path connecting the second output terminal to the lead. The lead is configured to combine the first and second output RF signals to produce a third output RF signal. The shunt-inductance circuit is coupled between the first output terminal and a ground reference.

22 Claims, 4 Drawing Sheets

(56) References Cited

U.S. PATENT DOCUMENTS

2008/0058001 A1* 3/2008 Kusunoki ................. H03F 3/68
 455/550.1
2014/0312976 A1* 10/2014 Noori ...................... H03F 3/195
 330/295

OTHER PUBLICATIONS

U.S. Appl. No. 16/667,113; not yet published; 39 pages (filed Oct. 29, 2019).

* cited by examiner

SYMMETRIC DOHERTY AMPLIFIER WITH IN-PACKAGE COMBINING NODE

TECHNICAL FIELD

Embodiments of the subject matter described herein relate generally to Doherty power amplifiers.

BACKGROUND

For many years, the Doherty power amplifier has been one of the most popular amplifiers for cellular infrastructure applications. A two-way Doherty amplifier includes a carrier amplifier and a peaking amplifier, which are connected in parallel between an amplifier input and an amplifier output. During operation, an input radio frequency (RF) signal is divided into carrier and peaking signals, and a phase difference of 90 degrees is applied between the carrier and peaking signals prior to amplification by the carrier and peaking amplifiers. On the output side, the amplified carrier and peaking signals are then phase-aligned before the amplified signals are combined together by a signal combiner.

A Doherty amplifier may have a symmetric or an asymmetric configuration, where each configuration type has its advantages and disadvantages. In a symmetric Doherty amplifier, the carrier and peaking amplifiers have substantially the same current-carrying capability, which may be achieved by utilizing carrier and peaking power amplifiers of the same transistor size (or periphery). Conversely, in an asymmetric Doherty amplifier, the peaking amplifier typically has a significantly greater current-carrying capacity than the carrier amplifier. This may be achieved by utilizing a significantly larger sized peaking power amplifier than the carrier power amplifier.

In comparison with asymmetric Doherty amplifiers, conventional symmetric Doherty amplifiers tend to have better gain, RF bandwidth, and linearity (i.e., the AM-AM/AM-PM behavior is favorable for linearization). However, the load modulation for a symmetric Doherty amplifier is limited only to 2 (i.e., the variable standing wave ratio (VSWR) is about 2:1). Accordingly, the efficiency boost obtained for a modulated load in the back-off Doherty condition tends to be better for a conventional symmetric Doherty amplifier than it is for a class-AB power amplifier. However, the efficiency boost for a conventional symmetric Doherty amplifier may be significantly poorer than for a conventional asymmetric Doherty amplifier. In contrast, because an asymmetric Doherty amplifier has a load modulation greater than 2 (i.e., VSWR>2:1), asymmetric Doherty amplifiers tend to have better back-off efficiency than both class-AB and conventional symmetric Doherty amplifiers. However, due to their nonlinear AM-AM/AM-PM behavior and the need for an uneven input RF signal split ratio, asymmetric Doherty amplifiers also are characterized by relatively lower back-off gain and poorer linearity, when compared with conventional symmetric Doherty amplifiers.

Amplifier designers strive to develop Doherty amplifier designs that achieve the advantages of both symmetric and asymmetric configurations, while avoiding the various disadvantages of the two configuration types. What is desired is a relatively simple Doherty amplifier design with reduced parasitic effects, relatively-simple impedance matching circuitry, relatively-high gain, and linearizable power added efficiency.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
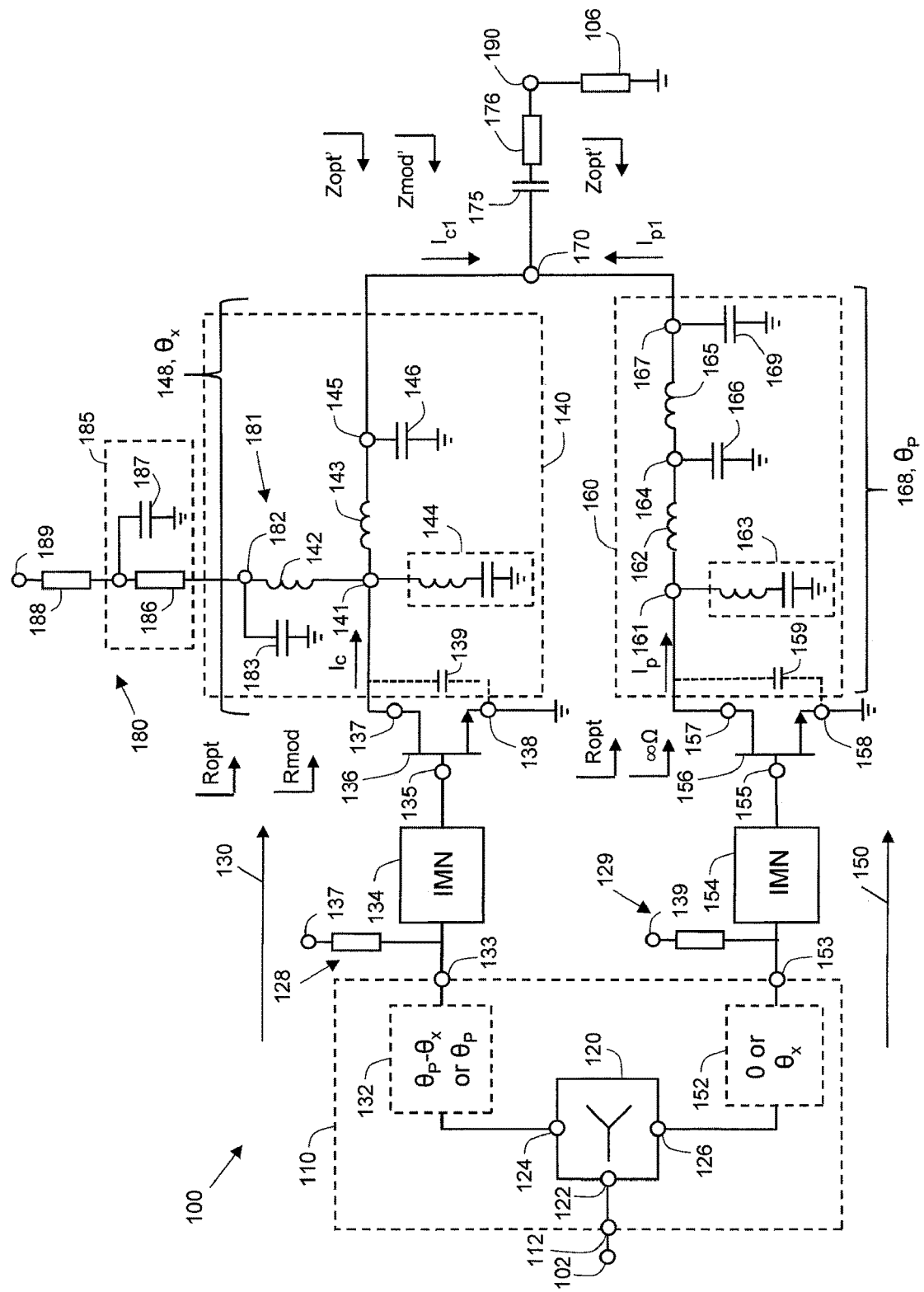
FIG. 1 is a schematic representation of a Doherty power amplifier, in accordance with an example embodiment.

Embodiments of the inventive subject matter include Doherty amplifier architectures that utilize symmetric or slightly asymmetric carrier and peaking power amplifier devices with in-package combining nodes, and that are coupled to (or terminated with) a real combining load matching circuit. In comparison with conventional, highly-asymmetric Doherty power amplifiers (e.g., asymmetric Doherty power amplifiers with a carrier to peaking ratio of 1:2 or greater), the Doherty amplifier embodiments described herein may have the advantages of a more simplified power device design, since both the carrier and peaking power amplifier devices may be substantially identical. The symmetric configuration of the Doherty amplifier embodiments enables the use of a symmetric input splitter (e.g., a 3 decibel (dB) input splitter), which may achieve higher gain and linearizable power added efficiency, when compared with asymmetric configurations. In addition, in a highly-asymmetric Doherty amplifier, the relatively-large peaking amplifier has a significantly larger source-drain capacitance than that of the carrier amplifier, and the asymmetrical parasitic effects increase the complexity of output matching circuits. Embodiments of the inventive subject matter exhibit reduced parasitic effects and ease of matching compared to conventional, highly-asymmetric Doherty amplifiers. Further, the various embodiments may have relatively simple and compact implementations, with the combining node located relatively close to the active die. Further still, the combining node impedance is designed to be about 50 ohms, in an embodiment, which may eliminate the need for an output transformer, which is typically included in a conventional Doherty power amplifier. This feature may improve the overall RF performance of the amplifier due to lower output losses and less dispersion across the frequency band of operation. Losses may be further reduced, in an embodiment, by minimizing the peaking amplifier output match phase length. Further still, in some embodiments, improved video bandwidth performance may be achieved by terminating baseband signal energy through a carrier shunt-inductance (shunt-L) circuit.

As used herein, the term "size", when referring to a physical characteristic of a power amplifier or power transistor, refers to the periphery or the current carrying capacity of the transistor(s) associated with that amplifier or transistor. The terms "symmetric" or "substantially symmetric", when referring to the relative sizes of carrier and peaking amplifiers, means that the size of the power transistor(s) forming the carrier amplifier is/are substantially identical to (i.e., within 5%) the size of the power transistor(s) forming the peaking amplifier. The term "slightly asymmetric", when referring to carrier and peaking amplifiers, means that the size of the power transistor(s) forming the carrier amplifier is/are about 5% to about 15% different from the size of the power transistor(s) forming the peaking amplifier. Conversely, the term "asymmetric," without any other qualifiers, means that the size of the power transistor(s) forming the carrier amplifier is/are more than 15% different from the size of the power transistor(s) forming the peaking amplifier. "Highly-asymmetric," as used herein, means that the size of the power transistor(s) forming the peaking amplifier is/are 100% or more than the size of the power transistor(s) forming the carrier amplifier. Accordingly, for example, when the ratio of carrier amplifier size to peaking amplifier size (or the "carrier-to-peaking ratio") is denoted as x:y (where x corresponds to relative carrier amplifier size and y corresponds to relative peaking amplifier size), a ratio of 1:1 would be symmetric, a ratio of 1:1.04 would be substantially symmetric, a ratio of 1:1.15 would be slightly asymmetric, and a ratio of 1:1.3 would be asymmetric, according to the above definitions. Further, as used herein, the term "shunt" means electrically coupled between a circuit node and a ground reference (or other DC voltage reference).

FIG. 1 illustrates a simplified schematic of a two-way Doherty power amplifier 100, according to an embodiment. Doherty amplifier 100 includes an RF input 102, an RF output 190, input circuitry 110, a carrier amplification path 130, a peaking amplification path 150, and a combining node 170. In an embodiment, an antenna 106 (or other type of load) is coupled to the combining node 170 through an output transmission line 176 and the RF output 190. According to an embodiment, an impedance at the combining node 170 (or an input impedance of the transmission line 176) is about equal to an input impedance of the antenna 106 (e.g., about 50 ohms or another load impedance). Accordingly, unlike conventional Doherty amplifier implementations, no impedance transformer is included between the combining node 170 and the RF output 190, according to an embodiment. In an alternate embodiment, the impedance at the combining node 170 is not equal to the input impedance of the antenna 106, and the output transmission line 176 also is configured as an impedance transformer (or matching network), which transforms the impedance at output 190 to the impedance at combining node 170.

Doherty power amplifier 100 is considered to be a "two-way" Doherty power amplifier, which includes one carrier amplification path 130 and one peaking amplification path 150. Essentially, the carrier amplifier 136 provides RF signal amplification along the carrier amplification path 130, and the peaking amplifier 156 provides RF signal amplification along the peaking amplification path 150. The amplified carrier and peaking RF signals are then combined at combining node 170 before provision through the DC blocking capacitor 175 to the output transmission line 176 and RF output 190.

The input circuitry 110 has an input 112 coupled to the RF input 102, and two outputs, where each output is coupled to either a carrier path input 133 or to a peaking path 153. The input circuitry 110 is configured to receive, at input 112, an input RF signal from RF input 102, and to divide the power of the input RF signal into a carrier input RF signal and a peaking RF input signal. The input circuitry 110 is further configured to provide, at carrier path input 133, the carrier input RF signal to the carrier amplification path 130, and to provide, at peaking path input 153, the peaking input RF signal to the peaking amplification path 150. According to an embodiment, the input circuitry 110 is configured to produce the carrier and peaking input RF signals with a desired phase difference (referred to as an "input phase offset") between the carrier and peaking input RF signals.

In some embodiments, the input circuitry 110 includes a digital signal processor configured to produce and provide the carrier and peaking input RF signals with the desired input phase offset. In other embodiments, and as illustrated in FIG. 1, the input circuitry 110 includes a power splitter 120 and one or more input phase shift elements 132, 152 (e.g., input offset lines) configured to produce and provide the carrier and peaking input RF signals with the desired input phase offset. The power splitter 120 has an input 122 coupled to the input circuitry input 112 and the RF input 102, and carrier and peaking outputs 124, 126 coupled to the carrier and peaking amplification paths 130, 150, respectively. Essentially, power splitter 120 is configured to divide the power of the input RF signal received at power splitter input 122 (through RF input 102 and input circuitry input 112) into carrier and peaking portions of the input signal (i.e., the carrier input RF signal and the peaking input RF signal). The carrier input RF signal is provided to the carrier amplification path 130 at power splitter output 124, and the peaking input RF signal is provided to the peaking amplification path 150 at power splitter output 126. As will be explained in more detail below, during operation in a relatively low-power mode, only the carrier amplifier 136 is supplying current to the output transmission line 176 and antenna 106, and the power splitter 120 provides the input signal power only to the carrier amplification path 130. Conversely, during operation in a relatively high-power mode, both the carrier and peaking amplifiers 136, 156 supply current to the output transmission line 176 and antenna 106, and the power splitter 120 divides the input signal power between the amplification paths 130, 150.

Power splitter 120 may have any of a variety of configurations, including Wilkinson-type splitters, hybrid quadrature splitters, and so on. Power splitter 120 divides the power of the input RF signal according to a carrier-to-peaking size ratio. For example, when Doherty amplifier 100 has a symmetric or substantially-symmetric Doherty amplifier configuration in which the carrier amplifier 136 and the peaking amplifier 156 are substantially equal in size (i.e., the Doherty amplifier 100 has a 1:1 to 1.05 carrier-to-peaking size ratio), the power splitter 120 may divide the power such that about half of the input signal power is provided to the carrier amplification path 130, and about half of the input signal power is provided to the peaking amplification path 150. Similarly, when Doherty amplifier 100 has a slightly asymmetric Doherty amplifier configuration (i.e., the Doherty amplifier 100 has a 1:1.05 to 1.15 carrier-to-peaking size ratio), the power splitter 120 may divide the power such that slightly less than half of the input signal power is provided to the carrier amplification path 130, and slightly more than half of the input signal power is provided to the peaking amplification path 150.

In Doherty amplifier 100, the input circuitry 110 is configured so that the input signal supplied to the peaking amplification path 150 is delayed by an input phase offset with respect to the input signal supplied to the carrier amplification path 130 at the center frequency of operation, f0, of the amplifier 100. When included, the carrier and/or peaking input phase shifters 132, 152 are configured to impart the desired input phase offset between the carrier and peaking input RF signals.

To ensure proper operation of the Doherty amplifier 100, and as will be described in detail below, the magnitude of the input phase offset is determined based on the electrical lengths 148, 168 of the carrier and peaking output circuits 140, 160. In other words, the values of the phase shifts imparted by phase shifters 132, 152 (which determine the input phase offset) depend on the electrical lengths 148, 168 of the carrier and peaking output circuits 140, 160, in an embodiment. The electrical length 148 of the carrier output circuit 140 is a non-zero value referred to herein as theta x ($\theta_x$), where 60°<$\theta_x$<150°. Essentially, the electrical length 148, $\theta_x$, corresponds to the phase shift imparted on the carrier output RF signal between the output 137 of the carrier amplifier 136 and the combining node 170 (i.e., the insertion phase length for the carrier amplifier output matching circuit). Additionally, the electrical length 168 of the peaking output circuit 160 is a non-zero value referred to herein as theta p ($\theta_p$), where 91°<$\theta_p$<179°. As will be explained in more detail below, the phasing relationship of the carrier and peaking output circuits 140, 160 on the output-side of the amplifiers 136, 156 determines the phasing applied to the carrier and peaking input RF signals on the input-side of the amplifiers 136, 156.

As a governing rule, the electrical length of the carrier amplification path 130 (i.e., a sum of the phase shift applied by phase shifter 132, the insertion phase of IMN 134, the insertion phase of amplification device 136, and the electrical length 148 ($\theta_x$) of the carrier output circuit 140, as affected by parasitic capacitance 139 and shunt-L circuit 181, described later) should equal the electrical length of the peaking amplification path 150 (i.e., a sum of the phase shift applied by phase shifter 152, the insertion phase of IMN 154, the insertion phase of amplification device 156, and the electrical length 168 of the peaking output circuit 160, as affected by parasitic capacitance 159 and shunt-L circuit 181) to ensure that the signals amplified along the carrier and peaking amplification paths 130, 150 combine coherently (in phase) at combining node 170. In two particular embodiments, referred to below as "minimum-phase" and "moderate-phase" embodiments, the phase shift applied by phase shifter 152 may be substantially equal either to zero degrees or to $\theta_x$, respectively. This indicates that at least two combinations of different phase shifts may be implemented with phase shifters 132, 152, while still ensuring coherency of the amplified carrier and peaking RF signals at combining node 170. In the minimum-phase embodiment:

1) PS 132 (phase shift imparted by phase shifter 132)=$\theta_p$−$\theta_x$;
  PS 152 (phase shift imparted by phase shifter 152)=0 degrees;
  EL 148 (electrical length 148 of carrier output circuit 140)=$\theta_x$; and
  EL 168 (electrical length 168 of peaking output circuit 160)=$\theta_p$.

When the electrical length of phase shifter 152 is about 0 degrees, phase shifter 152 may be excluded. In this example embodiment, the sum of the phase shift applied by phase shifter 132 ($\theta_p$−$\theta_x$, in this example) plus the electrical length 148 ($\theta_x$) of the carrier output circuit 140 equals $\theta_p$, and the sum of the phase shift applied by phase shifter 152 (0 degrees, in this example) plus the electrical length 168 ($\theta_p$, in this example) also equals $\theta_p$. Thus, assuming the insertion phases of the matching networks and amplification devices are equal, the total electrical lengths of the carrier and peaking amplifier paths are substantially equal to each other. In the moderate-phase embodiment:

2) PS 132 (phase shift imparted by phase shifter 132)=$\theta_p$;
  PS 152 (phase shift imparted by phase shifter 152)=$\theta_x$;
  EL 148 (electrical length 148 of carrier output circuit 140)=$\theta_x$; and
  EL 168 (electrical length 168 of peaking output circuit 160)=$\theta_p$.

In this example embodiment, the sum of the phase shift applied by phase shifter 132 ($\theta_p$, in this example) plus the electrical length 148 ($\theta_x$) of the carrier output circuit 140 equals $\theta_p$+$\theta_x$, and the sum of the phase shift applied by phase shifter 152 ($\theta_x$, in this example) plus the electrical length 168 ($\theta_p$) of the peaking output circuit 160 also equals $\theta_p$+$\theta_x$. Thus, assuming the insertion phases of the matching networks and amplification devices are equal, the total electrical lengths of the carrier and peaking amplifier paths again are substantially equal to each other.

The above combinations assume that the IMNs 134, 154 each impart the same insertion phase, and that the amplification devices 136, 156 also each impart the same insertion phase. In practice, the IMNs 134, 154 may impart different insertion phases and/or the amplification devices 136, 156 may impart different insertion phases. In a practical design, and as would be understood by those of skill in the art based on the description herein, when either or both the IMNs 134, 154 and/or the amplification devices 136, 156 impart different insertion phases from each other, the input phase shifters 132, 152 may have different phase shifts than the "ideal" phase shifts depicted in FIG. 1.

According to an embodiment, the input phase offset at the carrier and peaking path inputs 133, 153 is in a range from about 1 degrees to about 179 degrees (i.e., the input phase offset corresponds to a phase difference of 1 degree to 179 degrees between the carrier and peaking input RF signals at the carrier and peaking path inputs 133, 153).

The carrier input phase shifter 132, when included, may comprise distinct circuitry that forms a portion of the input circuitry 110, in one embodiment. In another embodiment, the functionality of the carrier input phase shifter 132 (i.e., the application of a phase shift to the carrier input RF signal) may be included in the power splitter 120. Similarly, the peaking input phase shifter 152 may include distinct circuitry that forms a portion of the input circuitry 110, in one embodiment. In another embodiment, the functionality of the peaking input phase shifter 152 (i.e., the application of a phase shift to the peaking input RF signal) may be included in the power splitter 120. In other words, the power splitter 120 may be configured to produce carrier and peaking RF input signals that have the desired input phase offset, and distinct input phase shifter(s) (e.g., phase shifter(s) 132, 152) may be excluded.

The carrier amplification path 130 includes a carrier input matching network (IMN) 134, the carrier amplifier 136, and a carrier output circuit 140. According to some embodiments, the carrier amplification path 130 also includes the carrier input phase shifter 132. Similarly, the peaking amplification path 150 includes a peaking IMN 154, the peaking amplifier 156, and a peaking output circuit 160. According to some embodiments, the peaking amplification path 150 also includes the peaking input phase shifter 152.

The carrier and peaking IMNs 134, 154 are coupled between the carrier and peaking path inputs 133, 153 and the carrier and peaking amplifiers 136, 156, respectively. The carrier and peaking IMNs 134, 154 each may include, for example, lowpass or bandpass circuits configured as T- or pi-impedance matching networks (referred to herein as "T-match" or "pi-match" networks), with one example being illustrated in FIG. 2 and discussed later. For example, each of the carrier and peaking IMNs 134, 154 may include a T-match network that includes two series-coupled inductors (e.g., wirebond arrays 333/335 for the carrier IMN, and 353/355 for the peaking IMN, FIG. 2) with a shunt capacitor (e.g., capacitor 334, 354, FIG. 2) coupled to a node between the inductors. However they are configured, the IMNs 134, 154 incrementally increase the circuit impedance toward the source impedance.

The carrier and peaking amplifiers 136, 156 each have a control input 135, 155 (e.g., a gate terminal) and two current-carrying terminals 137, 138, 157, 158 (e.g., drain and source terminals), where one of the current-carrying terminals 137, 157 (e.g., the drain terminal) of each amplifier 136, 156 functions as an output for an amplified RF signal produced by the amplifier 136, 156, and the other current-carrying terminal 138, 158 (e.g., the source terminal) of each amplifier 136, 156 may be coupled to a ground reference node. According to an embodiment, current-carrying terminals 137, 157 (e.g., drain terminals) correspond to an intrinsic current generator (e.g., an intrinsic drain) of the amplifier 136, 156. Capacitances 139, 159 represent parasitic capacitances (e.g., drain-source capacitances) present at the outputs 137, 157 of the carrier and peaking amplifiers 136, 156 (e.g., at the drain terminals of the final-stage power transistors). Although capacitances 139, 159 are not discrete physical components (e.g., discrete capacitors), capacitances 139, 159 are shown to be included within the carrier and peaking output circuits 140, 160, as their capacitance values may be substantial enough to affect the electrical lengths 148, 168 of the carrier and peaking output circuits 140, 160. According to an embodiment, capacitances 139, 159 each have a capacitance value in a range of about 0.25 picofarads (pF) to about 20 pF, although the capacitance values may be lower or higher, as well.

Figure 2:
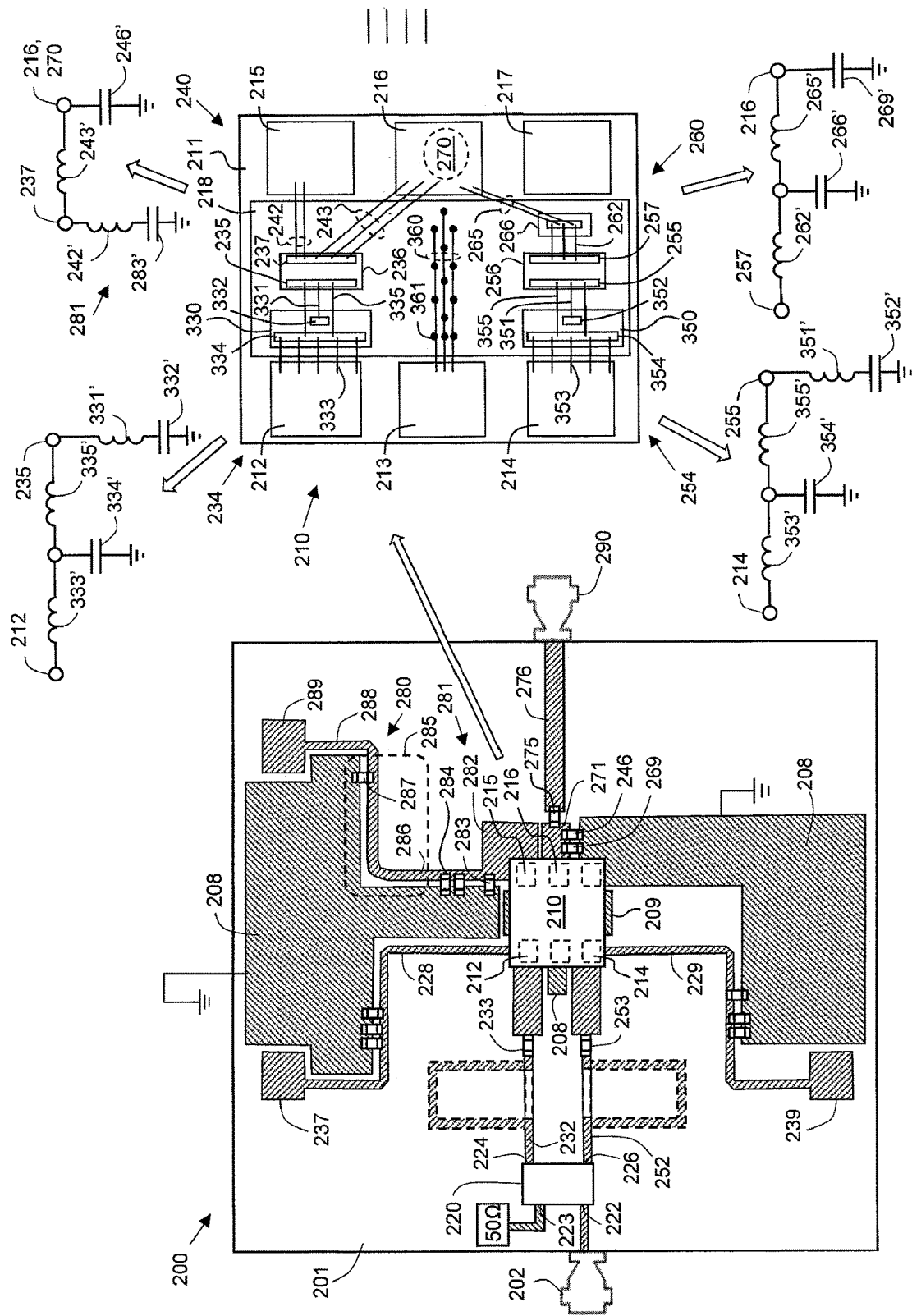
FIG. 2 is a top view of a physical implementation of a Doherty power amplifier module with an in-package combining node, in accordance with an example embodiment.
Figure 3:
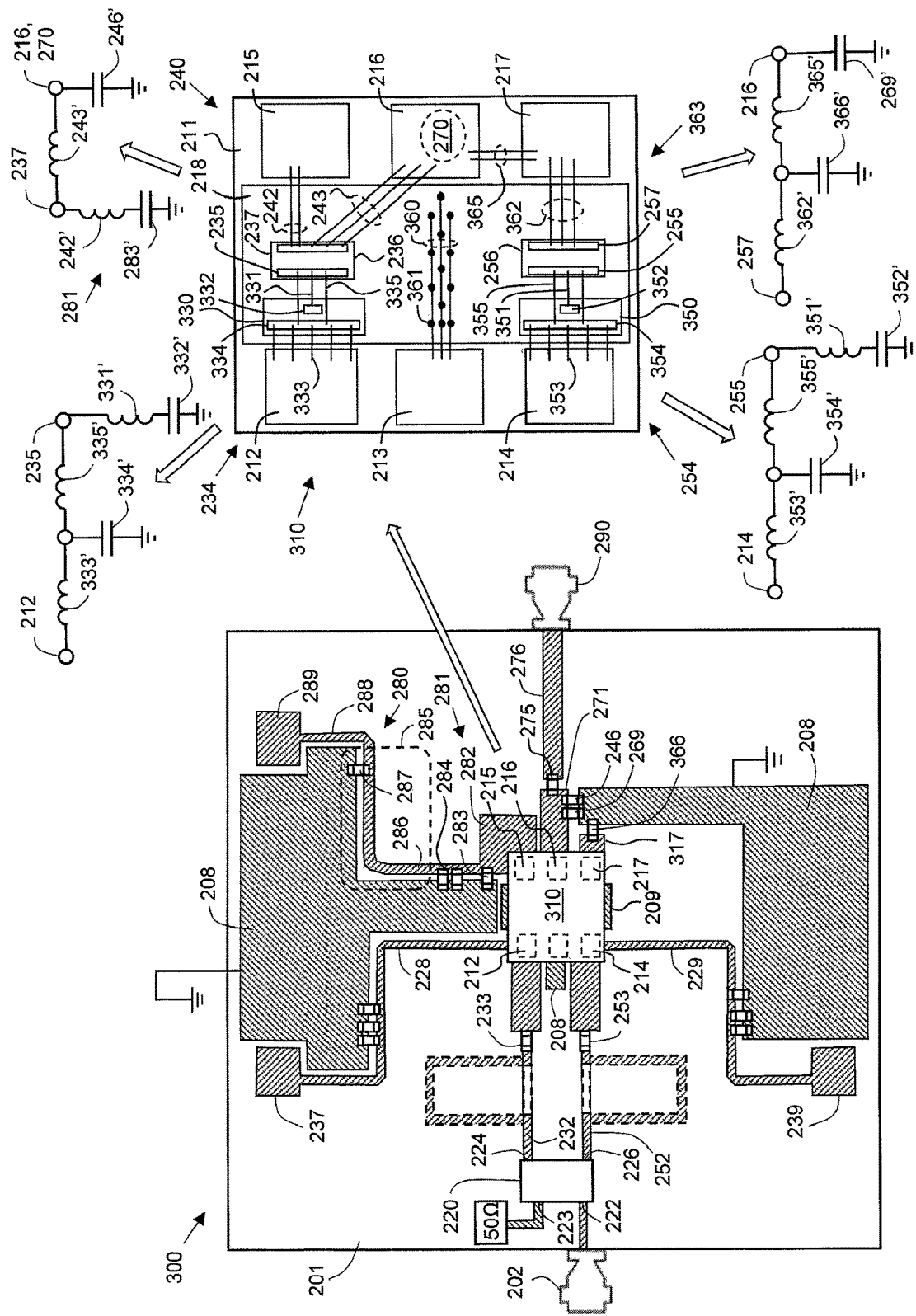
FIG. 3 is a top view of a physical implementation of a Doherty power amplifier module with an in-package combining node, in accordance with another example embodiment.
Figure 4:
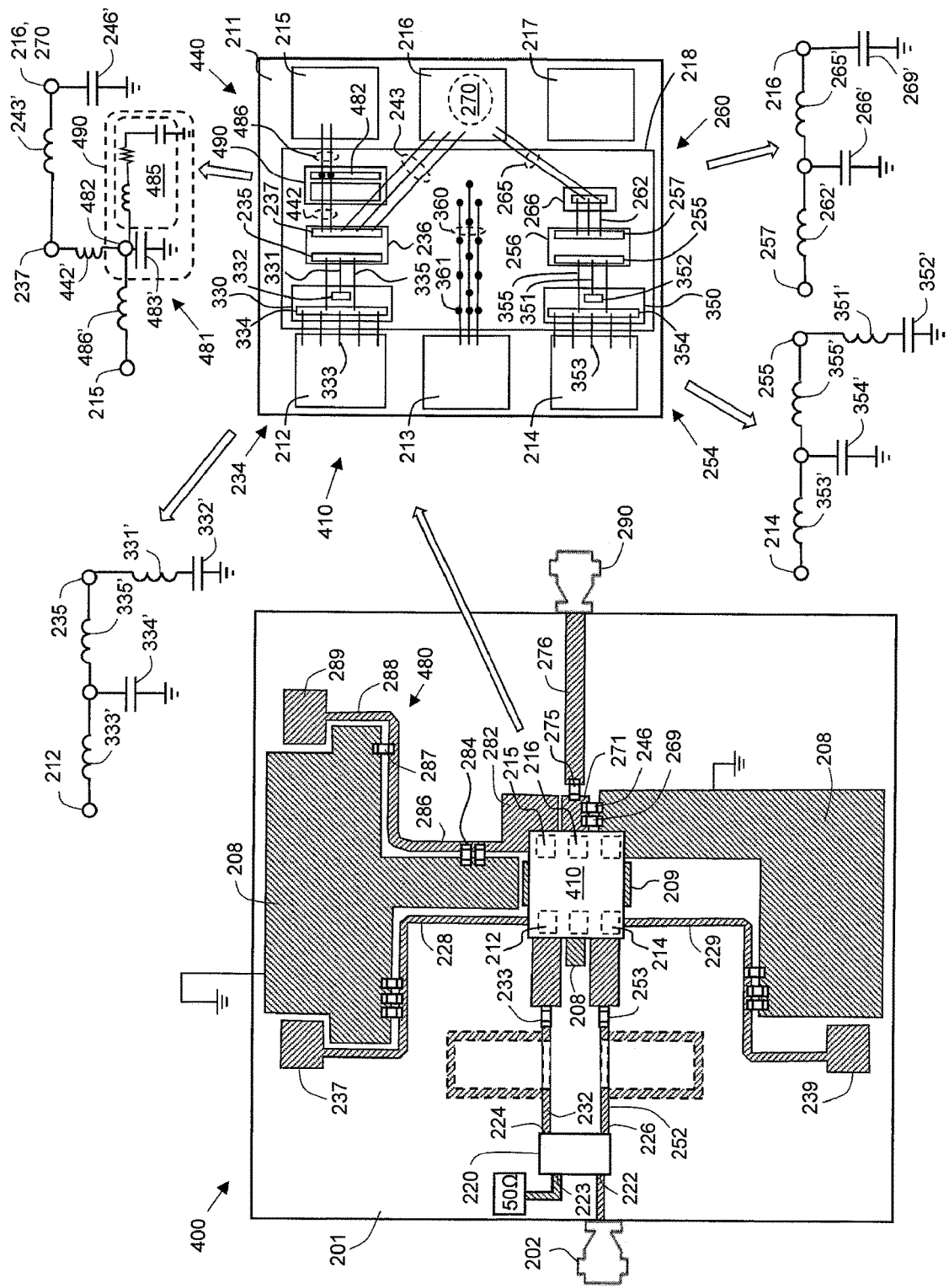
FIG. 4 is a top view of a physical implementation of a Doherty power amplifier module with an in-package combining node, in accordance with yet another example embodiment.

Each of the carrier and peaking amplifier 136, 156 includes one or more power transistors (e.g., field effect transistors) embodied in a semiconductor die (e.g., a single semiconductor die that includes both the carrier and peaking amplifier power transistors, or a separate die, such as die 236, 256, FIGS. 2-4, for each of the carrier and peaking amplifier transistors). In some embodiments, the semiconductor die(s) that include the carrier and peaking amplifiers 136, 156 may be packaged in a power amplifier package (e.g., power amplifier package 210, 310, 410, FIGS. 2-4), along with all or portions of the carrier and peaking IMNs 134, 154.

According to an embodiment, the carrier amplifier 136 and the peaking amplifier 156 each include a single-stage amplifier (i.e., an amplifier with a single amplification stage or power transistor). In other embodiments, the carrier amplifier 136 is a two-stage amplifier, which includes a relatively low-power driver amplifier (not shown) and a relatively high-power final-stage amplifier (not shown) connected in a cascade (or series) arrangement between the carrier amplifier input 135 and the carrier amplifier output 137. In the carrier amplifier cascade arrangement, an output (e.g., drain terminal) of the driver amplifier is electrically coupled to an input (e.g., gate terminal) of the final-stage amplifier. Similarly, the peaking amplifier 156 may include a two-stage amplifier, which includes a relatively low-power driver amplifier (not shown) and a relatively high-power final-stage amplifier (not shown) connected in a cascade arrangement between the peaking amplifier input 155 and the peaking amplifier output 157. In the peaking amplifier cascade arrangement, an output (e.g., drain terminal) of the driver amplifier is electrically coupled to an input (e.g., gate terminal) of the final-stage amplifier. In other embodiments, each of the carrier amplifier 136 and the peaking amplifier 156 may include more than two, cascade-coupled amplification stages.

As used herein, the "size" of an amplifier refers to the size of the output-stage transistor (i.e., the size of the single transistor in a single-stage amplifier, or the size of the final-stage transistor in a multi-stage amplifier). According to an embodiment, Doherty power amplifier 100 is symmetric or substantially symmetric, in that the carrier and peaking amplifiers 136, 156 are of substantially equal size (i.e., the peripheries/current carrying capacities of the carrier and peaking power transistors are substantially equal). In such embodiments, the carrier-to-peaking ratio may be in a range of about 1:1 to about 1:1.05, for example. In other embodiments, Doherty power amplifier 100 is slightly asymmetric, in that the carrier and peaking amplifiers 136, 156 are of modestly different size. In such embodiments, the carrier-to-peaking ratio may be in a range of about 1:05 to about 1:1.15, for example.

According to an embodiment, various DC bias circuits are coupled to the inputs 135, 155 and to the outputs 137, 157 of the carrier and peaking amplifiers 136, 156, in order to convey DC bias voltages that will ensure proper operation of the Doherty amplifier 100. More specifically, during operation of Doherty amplifier 100, the carrier amplifier 136 is biased to operate in class AB mode or deep class AB mode, and the peaking amplifier 156 is biased to operate in class C mode or deep class C mode. In some configurations, the peaking amplifier 156 may be biased to operate in class B mode.

DC bias circuits 128 and 129 are coupled to the inputs 135, 155 (e.g., to the gate terminals) of the carrier and peaking amplifiers 136, 156, respectively. In order to provide carrier and peaking gate bias voltages, Vg1 and Vg2, respectively, to the inputs (e.g., gate terminals) of amplifiers 136, 156, external DC bias voltage sources (not illustrated) are connected to the DC bias voltage input terminals 137 and 139.

Further, DC bias circuit 180 is coupled to the outputs 137, 157 (e.g., to the drain terminals) of the carrier and peaking amplifiers 136, 156 through node 141. As will be explained in more detail below, DC bias circuit 180 also includes or is coupled to other circuitry, including a shunt-inductance (shunt-L) circuit 181 and a baseband termination circuit 185, which may beneficially affect operation of the amplifier 100. In the embodiment of FIG. 1, in order to provide a DC bias voltage, Vdd, to the outputs (e.g., drains) of amplifiers 136, 156, bias circuit 180 includes inductance 142, a shunt DC blocking capacitor 183 (also referred to as an "RF decoupling capacitor"), a DC bias voltage input terminal 189, and an external DC bias voltage source (not illustrated) connected to the DC bias voltage input terminal 189. Although not shown in FIG. 1, the bias circuit 180 also may include one or more shunt baseband decoupling capacitors (e.g., capacitors 284, FIGS. 2-4). A first terminal of inductance 142 is coupled to node 141, and a second terminal of inductance 142 is coupled to node 182. A first terminal of DC blocking capacitor 183 is coupled to node 182, and a second terminal of DC blocking capacitor 183 is coupled to a ground reference. Node 182 is coupled to the DC bias input terminal 189 through transmission lines 186 and 188, in an embodiment. The output 137 (e.g., drain terminal) of amplifier 136 receives the DC bias voltage, Vdd, through input 189, transmission lines 188 and 186, inductance 142, and node 141. The output 157 (e.g., drain terminal) of amplifier 156 receives the DC bias voltage through input 189, transmission lines 188 and 186, inductance 142, node 141, and inductances 143, 165, 162, in an embodiment. Accordingly, in the illustrated embodiment, both amplifiers 136, 156 receive the output DC bias voltage, Vdd, through a single (common) DC voltage supply.

According to an embodiment, inductance 142 and capacitor 183 have component values that configure the series combination of inductance 142 and capacitor 183 as a shunt-L circuit 181. Essentially, the shunt-L circuit 181 forms a portion of the output circuit 140 (and more particularly the output matching circuit portion of the output circuit 140), and the shunt-L circuit 181 is configured to compensate for (e.g., at least partially resonate out) the drain-source capacitances 139, 159 at the outputs 137, 157 of the carrier and peaking amplifiers 136, 156.

According to a further embodiment, a low-impedance baseband termination circuit 185 is implemented within the bias circuit 180, as well. More specifically, the baseband termination circuit 185 is coupled to node 182 located between inductance 142 and capacitor 183. The baseband termination circuit 185 includes an effective inductance provided by transmission line 186, and a shunt capacitor 187, in an embodiment. Transmission line 186 has a first end coupled to the RF cold point node 182, and a second end coupled to an intermediate node between transmission lines 186 and 188. Shunt capacitor 187 is coupled between the intermediate node and the ground reference.

Essentially, the baseband termination circuit 185 is configured to improve the low frequency resonance (LFR) of amplifier 100 caused by the interaction between various circuitry and structures of the amplifier 100 by presenting a low impedance at envelope frequencies and/or a high impedance at RF frequencies. The transmission line 186 and the capacitor 183 are configured or selected to have a specific effective inductance and capacitance values, respectively, so that node 182 has a low impedance at baseband frequencies and a high impedance to RF signal energy (e.g., to minimize leakage through circuit 185 of signal energy associated with RF signals at or near the center frequency of operation of the amplifier 100). Node 182 essentially functions as a virtual ground reference for signal energy at baseband frequencies (e.g., frequencies above DC and up to the lower edge of the frequency band of operation of the amplifier 100). Due to the above-described characteristics, node 182 also may be referred to as an "RF cold point" node (i.e., a high impedance node to RF signal energy).

The carrier and peaking amplifiers 136, 156 are coupled to the combining node 170 through carrier and peaking output circuits 140, 160, respectively. At low to moderate input signal power levels (i.e., where the power of the input signal at RF input 102 is lower than the turn-on threshold level of peaking amplifier 156), the Doherty amplifier 100 operates in a low-power mode in which the carrier amplifier 136 operates to amplify the input signal, and the peaking amplifier 156 is minimally conducting (e.g., the peaking amplifier 156 essentially is in an off state). During this phase of operation, the carrier output circuit 140 determines the maximum VSWR (voltage standing wave ratio) to which the carrier amplifier 136 will be exposed. Conversely, as the input signal power increases to a level at which the carrier amplifier 136 reaches voltage saturation, the power splitter 120 divides the energy of the input signal between the carrier and peaking amplifier paths 130, 150, and both amplifiers 136, 156 operate to amplify their respective portion of the input signal.

As the input signal level increases beyond the point at which the carrier amplifier 136 is operating in compression, the peaking amplifier 156 conduction also increases, thus supplying more current to the output transmission line 176 and antenna 106. In response, the load line impedance of the carrier amplifier output decreases. In fact, an impedance modulation effect occurs in which the load line of the carrier amplifier 136 changes dynamically in response to the input signal power (i.e., the peaking amplifier 156 provides active load pulling to the carrier amplifier 136). The carrier output circuit 140, which is coupled between the output 137 of the carrier amplifier 136 and the combining node 170, transforms the carrier amplifier load line impedance to a high value at backoff, allowing the carrier amplifier 136 to efficiently supply power to the real combining load circuit 180 and antenna 106 over an extended output power range.

The electrical length 148 of the carrier output circuit 140, including the adjustment imparted by the parasitic output capacitance 139 and the shunt-L circuit 181, corresponds to the phase shift applied by the carrier output circuit 140 to the carrier RF output signal between the carrier amplifier output 137 and the combining node 170. Similarly, the electrical length 168 of the peaking output circuit 160, including the adjustment imparted by the parasitic output capacitance 159, corresponds to the phase shift applied by the peaking output circuit 160 to the peaking RF output signal between the peaking amplifier output 157 and the combining node 170. According to one embodiment, and as mentioned above, the peaking output circuit 160, which is connected between the peaking amplifier output 157 and the combining node 170, may have an electrical length 168 of $\theta_p$, where $91° < \theta_p < 179°$. According to further embodiments, and as also mentioned above, the carrier output circuit 140, which is connected between the carrier amplifier output 137 and the combining node 170, has an electrical length 148 of $\theta_x$, where $60° < \theta_x < 150°$.

The carrier and peaking output circuits 140, 160 are configured to increase the circuit impedance toward the load impedance, and to establish the desired electrical lengths 148, 168 discussed above. According to an embodiment, carrier output circuit 140 is configured as a hybrid pi-match network, which comprises the shunt-L circuit 181, a series inductance 143, and a shunt capacitor 146. As discussed above, the shunt-L circuit 181 is coupled between node 141 (and the output 137 of amplifier 136) and the ground reference. The series inductance 143 has a first terminal coupled to node 141 (and the output 137 of amplifier 136), and a second terminal coupled to the combining node 170 through node 145. The shunt capacitor 146 has a first terminal coupled to node 145, and a second terminal coupled to the ground reference.

According to a further embodiment, the peaking output circuit 160 is configured as a pi-match network, which comprises first and second series inductances 162, 165, and first and second shunt capacitors 166, 169. The first series inductance 162 has a first terminal coupled to node 161 (and the output 157 of amplifier 156), and a second terminal coupled to intermediate node 164. The second series inductance has a first terminal coupled to intermediate node 164, and a second terminal coupled to the combining node 170 through node 167. The shunt capacitor 166 has a first terminal coupled to node 164, and a second terminal coupled to the ground reference. Finally, the shunt capacitor 169 has a first terminal coupled to node 167, and a second terminal coupled to the ground reference.

As will be described in more detail in conjunction with FIGS. 2-4, each of inductances 142, 143, 162, 165 may be implemented with wirebonds (e.g., wirebond arrays 242, 243, 262, 265, 362, 365, 442, FIGS. 2-4). Accordingly, even though inductances 142, 143, 162, 167 have non-trivial inductance values, they are not referred to as "inductors," which may imply a discrete inductor component (e.g., a surface mount inductor or an integrated spiral inductor). In some embodiments, all or portions of the inductances provided by these elements may be implemented using discrete inductors, and accordingly the terms "inductance" and "inductor" may be used interchangeably herein. Further, each of capacitors 146, 166, 169 may be implemented as surface mount capacitors or integrated capacitors (e.g., metal-insulator-metal (MIM) capacitors integrated within an integrated passive device (IPD)).

According to an embodiment in which the center frequency of operation, f0, is in a range of about 800 megahertz (MHz) to about 6 gigahertz (GHz), inductance 142 has an inductance value in a range of about 0.1 nanohenries (nH) to about 4 nH, capacitor 183 has a capacitance value in a range of about 1 pF to about 30 pF, inductance 143 has an inductance value in a range of about 0.2 nH to about 3 nH, capacitor 146 has a capacitance value in a range of about 0.2 pF to about 5 pF, inductance 162 has an inductance value in a range of about 0.2 nH to about 3 nH, capacitor 166 has a capacitance value in a range of about 0.2 pF to about 5 pF, inductance 165 has an inductance value in a range of about 0.2 nH to about 3 nH, and capacitor 169 has a capacitance value in a range of about 0.2 pF to about 5 pF. In other embodiments, the component values may be lower or higher than the boundaries of the above-given component value ranges.

In addition to the above-described circuitry, the carrier and peaking output circuits 140, 160 each may include a harmonic termination circuit 144, 163, in an embodiment. Each harmonic termination circuit 144, 163 includes an inductive element and capacitance coupled in series between nodes 141, 161, respectively, and the ground reference. According to an embodiment, values for the inductive elements and the capacitances are selected so that the harmonic termination circuits 144, 163 are resonant at or near a second harmonic frequency, 2f0, for the amplifier 100 (i.e., about twice the center frequency of operation, f0). Essentially, the series combination of the inductance and capacitance function as a low impedance path to ground for signal energy at the second harmonic frequency, 2f0. In other embodiments, the harmonic frequency termination circuits 144, 163 may be connected to nodes at the input sides of the amplifiers 136, 156 (e.g., to inputs 133, 153 or to the input terminals 135, 155 of amplifiers 136, 156, as shown in FIGS. 2-4), or the harmonic frequency termination circuits 144, 163 may be excluded altogether.

The above-described configurations provide correct phase relationships for optimal load modulation, and ensure that the amplified signals from the carrier and peaking paths 130, 150 arrive in phase (or coherently) at the combining node 170. Combining node 170 includes a conductive structure that is suitable for combining the amplified RF signals produced by the carrier and peaking amplification paths 130, 150. As will be described in more detail in conjunction with FIGS. 2-4, combining node 170 may be implemented as a portion of a lead (e.g., lead 216, FIGS. 2-4) of a packaged amplifier device (e.g., device 210, 310, 410, FIGS. 2-4), in various embodiments. Thus, combining node 170 may be considered to be an "in-package" combining node, as opposed to a conventional combining node that may be implemented on a substrate (e.g., a printed circuit board) to which the packaged amplifier device is mounted.

According to an embodiment, a DC blocking capacitor 175 and a transmission line 176 are coupled between the combining node 170 and the RF output 190, and the RF output 190 is coupled to antenna 106 (or another type of load). In a physical implementation of Doherty amplifier 100, RF output 190 may be implemented with an RF connector (e.g., connector 290, FIG. 2).

In an embodiment, the transmission line 176 has a real impedance (resistance) that is equal to (or about equal to) an impedance (resistance) of the antenna 190, Rcomb. For example, the impedance of antenna 190 may be about 50 ohms, and transmission line 176 may be implemented with a 50 ohm transmission line. During backoff operation when only the carrier amplifier 136 is providing current, Ic1, to the antenna 106, the output impedance of the carrier amplifier path 130, Zmod', is defined according to Equation 1, below. Conversely, and assuming that amplifier 100 is a symmetric or substantially symmetric Doherty amplifier, when the amplifier 100 reaches the saturated power of the device and both the carrier amplifier 136 and the peaking amplifier 156 are providing current, Ic1 and Ip1, respectively, to the antenna 106, the output impedances of both the carrier amplifier path 130 and the peaking amplifier path 150, Zopt', are about equal to 2·Rcomb, as defined in Equations 2 and 3, below. More specifically:

$$Zmod' = \frac{Z_0 \cdot R_{comb}}{Z_0 + j \cdot R_{comb} \cdot \tan(\theta_p)}, \text{ and} \quad \text{Equation 1}$$

$$Zopt' = \left(1 + \frac{I_{p1}}{I_{c1}}\right) \cdot R_{comb}, \quad \text{Equation 2}$$

where $Z_0$ is the equivalent characteristic impedance of the peaking output matching network. In the various embodiments in which the amplifier is a symmetrical or substantially symmetrical Doherty amplifier in which Ic1=Ip1:

$$Zopt' = 2 \cdot R_{comb}. \quad \text{Equation 3}$$

At the current generator, Rmod=n·Ropt, where n is the load modulation, and further where:

$$n = \frac{1 + |\Gamma_{C1}|}{1 - |\Gamma_{C1}|}, \text{ where} \quad \text{Equation 4}$$

$$\Gamma_{C1} = \frac{Zopt' - Zmod'}{Zopt' + Zmod'}, \text{ and} \quad \text{Equation 5}$$

α=10 $\log_{10}(2 \cdot n)$ is the backoff condition where the first efficiency peak occurs during operation.

Several physical implementations of Doherty amplifier 100 (FIG. 1) will now be described in conjunction with FIGS. 2-4, each of which is a top view of a Doherty amplifier module 200, 300, 400, in accordance with various example embodiments. In each of FIGS. 2-4, enlarged, top, interior views of various embodiments of packaged power amplifier devices 210, 310, 410 also are shown, in order to correlate the electrical circuitry implemented within those devices 210, 310, 410 with corresponding circuit elements in FIG. 1.

Referring first to FIG. 2, the components of Doherty amplifier module 200 are coupled to and/or mounted on a mounting surface of a module substrate 201, such as a single-layer or multi-layer printed circuit board (PCB), for example. A patterned conductive layer at the mounting surface of module substrate 201 includes a plurality of conductive features (also referred to herein as "transmission lines" or "traces") that function to electrically connect the various components of Doherty amplifier module 200 to each other and to external system components, voltage sources, and/or voltage references (e.g., a ground reference). More specifically, certain ones of the conductive features (e.g., transmission lines 232, 252, 271, 276) are configured to conduct RF signals. Other ones of the conductive features (e.g., traces 208, 209) are configured to be electrically coupled to a ground reference (e.g., an external system ground), and thus are referred to as "ground reference traces". Still other ones of the conductive features (e.g., traces 230, 231, 286, 288) are configured to convey DC bias voltages to power transistors implemented in packaged amplifier device 210. According to an embodiment, a conductive layer at the bottom surface of the module substrate 201 (i.e., the surface opposite the mounting surface) is coupled through the module substrate 201 to the ground reference traces 208, 209, and the bottom conductive layer serves as a ground reference node for the module substrate 201 (i.e., a node that can be coupled to system ground when the amplifier module 200 is incorporated into a larger electrical system).

Doherty amplifier module 200 includes an input RF connector 202 (e.g., RF input 102, FIG. 1), a power splitter 220 (e.g., power splitter 120, FIG. 1), a carrier input transmission line 232, a peaking input transmission line 252, a packaged amplifier device 210, an output transmission line 276 (e.g., transmission line 176, FIG. 1), gate bias circuits 228, 229, a drain bias circuit 280 (e.g., bias circuit 180, FIG. 1), and an RF output 290 (e.g., RF output 190, FIG. 1). As shown in the enlarged interior view of the packaged amplifier device 210 on the right side of FIG. 2, the packaged amplifier device 210 includes a carrier input matching network 234 (e.g., carrier IMN 134, FIG. 1), a peaking input matching network 254 (e.g., peaking IMN 154, FIG. 1), a carrier amplifier 236 (e.g., carrier amplifier 136, FIG. 1), a peaking amplifier 256 (e.g., peaking amplifier 156, FIG. 1), at least a portion of a carrier output circuit 240 (e.g., carrier output circuit 140, FIG. 1), at least a portion of a peaking output circuit 260 (e.g., peaking output circuit 160, FIG. 1), and a combining node 270 (e.g., combining node 170, FIG. 1), as will be described in more detail later.

The input RF connector 202 is electrically coupled to an input 222 (or a first port) of the power splitter 220. For example, a conductive trace or transmission line on the module substrate 201 may electrically connect the input RF connector 202 to input 222 (e.g., input 122, FIG. 1) of the power splitter 220. A second port 223 of the power splitter 220 may be coupled to a 50 ohm termination to ground. The power splitter 220 may be a discretely-packaged component mounted to the surface of module substrate 201, in one embodiment, or may be implemented using conductive traces on the module substrate 201. Either way, the power splitter 220 is configured to divide the power of the input RF signal received at power splitter input 222 into carrier and peaking portions of the input signal (i.e., the carrier input RF signal and the peaking input RF signal).

The carrier input RF signal is provided to the carrier amplification path at power splitter output 224 (or a third port, e.g., splitter output 124, FIG. 1), and the peaking input RF signal is provided to the peaking amplification path at power splitter output 226 (or a fourth port, e.g., splitter output 126, FIG. 1). More specifically, power splitter output 224 is coupled to a carrier amplifier input lead 212 of device 210 (described below) through the carrier input transmission line 232 and a DC blocking capacitor 233, and power splitter output 226 is coupled to a peaking amplifier input lead 214 of device 210 through the peaking input transmission line 252 and DC blocking capacitor 253. Accordingly, power splitter output 224 is connected to the proximal end of transmission line 232, and power splitter output 226 is connected to the proximal end of transmission line 252.

As discussed previously in conjunction with FIG. 1, the input circuit between the first power splitter output 224 (e.g., splitter output 124, FIG. 1) and the input to the carrier amplifier (e.g., input 135, FIG. 1, which essentially corresponds to the input terminal 235 of the carrier amplifier die 236, discussed below) is characterized by an electrical length, at a center frequency of operation of the amplifier, of either $\theta_x-\theta_p$ or $\theta_p$. Further, the input circuit between the second power splitter output 226 (e.g., splitter output 126, FIG. 1) and the input to the peaking amplifier (e.g., input 155, FIG. 1, which essentially corresponds to the input terminal 255 of the peaking amplifier die 256, discussed below) is characterized by an electrical length of either 0 degrees or $\theta_x$. A significant portion of the electrical lengths (and associated phase delays) are provided by the carrier and peaking input transmission lines 232, 252, each of which essentially may serve the functionality of a phase shifter (e.g., phase shifters 132, 152, FIG. 1) by having an electrical length that imparts a desired input phase offset between the carrier and peaking input signals. In FIG. 2, the carrier and peaking input transmission lines 232, 252 are indicted (with dashed outlines) to have two alternate physical (and thus electrical) lengths to indicate the alternate total phase delays applied between the power splitter outputs 224, 226 and the corresponding amplifier input terminals 235, 255.

Gate bias circuits 228, 229 may be provided on the module substrate 201 to enable gate bias voltages to be provided (e.g., through package leads 212 and 214, respectively) to the inputs (e.g., gate terminals) of amplifiers 236, 256, which are described in more detail below. To provide the gate bias voltages, each of the gate bias circuits 228, 229 may be connected through pads 237 and 239, respectively, to external DC voltage sources, which are configured to provide the desired gate bias voltages.

Packaged amplifier device 210 is coupled to the top surface of module substrate 201. Referring to the enlarged, interior view of device 210 at the right side of FIG. 2, packaged amplifier device 210 includes a device substrate 211, a carrier amplifier die 236, a peaking amplifier die 256, and a plurality of additional components, as will be described in more detail below. Briefly referring also to FIG. 1, the packaged amplifier device 210 essentially includes those portions of Doherty amplifier 100 between the carrier and peaking path inputs 133, 153 and the combining node 170.

As illustrated in FIG. 2, device 210 may be configured as a type of "no-leads" device (e.g., a dual-flat no-leads (DFN) device), which may be surface mounted to the module substrate 201. Accordingly, the device substrate 211 includes a plurality of conductive package leads 212, 213, 214, 215, 216, 217 and component mounting substrate (e.g., a conductive flange 218), which are encapsulated together in fixed spatial relationships. Top surfaces of the package leads 212-217, the flange 218, and the encapsulation define a mounting surface of the substrate 211, and the package leads 212-217 and the flange 218 extend from the mounting surface to the bottom surface of the substrate 211 and the device 210. The exposed bottom surfaces of the leads 212-217 correspond to package lands, and conductive connections (e.g., solder connections) are used to electrically and mechanically connect the lands (i.e., bottom surfaces of leads 212-217) and the bottom surface of the flange 218 to corresponding conductive features on the module substrate 201. For example, the leads 212-217 may be electrically and mechanically connected to the conductive features on the module substrate 201 using solder, conductive adhesive, or other suitable means. In the embodiment of FIG. 2, lead 212 is connected to the distal end of transmission line 232 (through capacitor 233), lead 213 is connected to a ground reference trace 208, lead 214 is connected to the distal end of transmission line 252 (through capacitor 253), lead 215 is connected to a conductive feature 282, lead 216 is connected to a proximal end of an output transmission line 276 (through capacitor 275), and lead 217 is connected to a ground reference trace 208.

Additional overmolding encapsulation, not shown in the enlarged view of the device 210 in FIG. 2, may be used to cover the mounting surface of the device substrate 211 and the components connected thereto. Although device 210 is configured in FIG. 2 as a DFN device, in alternate embodiments, device 210 may be configured as a quad-flat no-leads (QFN) device, or the conductive package leads 212-217 may be gull-wing or other types of leads that extend from an interior of the device 210 out the sides of the package body. Either way, a first one of the conductive leads 212 on a first side of the device 210 (or an "input side" of the device) corresponds to an input to the carrier amplifier (e.g., carrier path input 133, FIG. 1), and a second one of the conductive leads 214 on the input side of the device 210 corresponds to an input to the peaking amplifier (e.g., peaking path input 153, FIG. 1). A third one of the conductive leads 216 on a second side of the device 210 (or an "output side" of the device) corresponds to the combining node 270 (e.g., combining node 170, FIG. 1) of the amplifier.

Within device 210, the carrier and peaking amplifier dies 236, 256 are connected to a top surface of the flange 218, and the flange 218 is configured to provide a ground reference to the dies 236, 256, as well as functioning as a heat dissipation structure to dissipate heat generated by the dies 236, 256 during operation. According to an embodiment, the flange 218 includes a solid conductive material structure (e.g., a structure formed from bulk copper or other suitable materials). In other embodiments, the flange 218 may have a different construction, but either way, the flange 218 has a conductive top surface, a conductive bottom surface, and an electrical and thermal path between the conductive top and bottom surfaces.

A bottom surface of device 210, and more specifically a bottom surface of the conductive flange 218, is coupled to a conductive feature 209 that is co-planar with and exposed at the mounting surface of the module substrate 201, in an embodiment. For example, the conductive feature 209 may include a conductive coin or an array of conductive vias that extend between the top and bottom surfaces of the module substrate 201. As with the flange 218, the conductive feature 209 may function both as a heat dissipation structure to provide a thermal path for heat generated by the device 210 and as a ground reference node for the device 210 (i.e., the conductive feature 209 may be coupled to an external ground reference).

As mentioned above, the carrier and peaking amplifier dies 236, 256 are connected to a top surface of the device substrate 211. Each of the carrier amplifier die 236 and the peaking amplifier die 256 includes a single power transistor or multiple cascaded power transistors for amplifying an RF signal conducted through the die 236, 256. As used herein, the term "transistor" means a field effect transistor (FET) or another type of suitable transistor. For example, a "FET" may be a metal-oxide-semiconductor FET (MOSFET), a laterally-diffused MOSFET (LDMOS FET), an enhancement-mode or depletion-mode high electron mobility transistor (HEMT), or another type of FET. According to various embodiments, each of the power transistors in the carrier and peaking amplifier dies 236, 256 may be implemented, for example, using a silicon-based FET (e.g., an LDMOS FET), a silicon-germanium (SiGe) based FET, or a III-V FET (e.g., a HEMT), such as a gallium nitride (GaN) FET (or another type of III-V transistor, including a gallium arsenide (GaAs) FET, a gallium phosphide (GaP) FET, an indium phosphide (InP) FET, or an indium antimonide (InSb) FET). In some embodiments, the carrier and peaking amplifier dies 236, 256 utilize transistor technologies with relatively low output parasitic capacitances (e.g., capacitances 139, 159, FIG. 1), such as GaN transistor technologies, which have output parasitic capacitances in a range of about 0.25 pF to about 20 pF.

In the embodiment of FIG. 2, each of the carrier amplifier die 236 and the peaking amplifier die 256 embodies a single-stage amplifier that includes a single power transistor with a gate terminal (or control terminal) coupled to an input terminal 235, 255 of the die 236, 256, a drain terminal (or first current-carrying terminal) coupled to an output terminal 237, 257 of the die 236, 256, and a source terminal (or second current-carrying terminal) coupled to a ground reference. In an alternate embodiment, each of the carrier amplifier die 236 and the peaking amplifier die 256 may embody a two-stage amplifier that includes a pre-amplifier transistor and a final-stage power transistor coupled in a cascade arrangement. In such an embodiment, the input terminal 235, 255 of each die 236, 256 is coupled to the gate terminal of the pre-amplifier transistor, and the output terminal 237, 257 of each die 236, 256 is coupled to the drain terminal of the final-stage power transistor.

The carrier amplification path (e.g., path 130, FIG. 1) is electrically coupled between package lead 212 (referred to as the "carrier input lead") and package lead 216 (referred to as the "combining node lead"). The carrier amplification path includes a carrier input matching network 234 (e.g., carrier IMN 134, FIG. 1), the carrier amplifier die 236, and a carrier output circuit 240 (e.g., carrier output circuit 140, FIG. 1). As depicted schematically above and to the left of the enlarged view of device 210, the carrier input matching network 234 includes a T-match network, in an embodiment, which includes first and second inductances 333', 335' in the physical form of first and second sets of wirebonds 333, 353 coupled in series between the carrier input lead 212 and the input terminal 235 of the carrier amplifier die 236 (or more specifically, the gate terminal of a pre-amplifier or single-stage power transistor within die 236). In addition, the carrier input matching network 234 includes a shunt capacitance 334', in the form of a capacitor 334 coupled to the top surface of flange 218. The capacitor 334 may be a surface mount device, in some embodiments, or the capacitor 334 may be a MIM capacitor integrated within an IPD, as illustrated in FIG. 2, in other embodiments. Either way, a first terminal of capacitor 334 is electrically coupled to a node between inductances 333', 335' (e.g. a bonding pad on the top surface of capacitor 334 to which wirebonds 333, 353 are connected), and a second terminal of capacitor 334 is electrically coupled to a ground reference (e.g., to flange 218).

In the embodiment illustrated in FIG. 2, a harmonic termination circuit (e.g., circuit 144, FIG. 1) also is coupled between the carrier input lead 212 and the ground reference. As discussed in conjunction with FIG. 1, the harmonic termination circuit may include an inductance 331' (e.g., in the form of a third set of wirebonds 331) and a capacitor 332' (e.g., a surface mount capacitor or a MIM capacitor 332 within an IPD) coupled in series between the carrier input lead 212 and the ground reference. In an alternate embodiment, as described in conjunction with FIG. 1, the harmonic termination circuit may be included in the carrier output circuit 240 (e.g., harmonic termination circuit 144, FIG. 1).

The carrier output circuit 240 (e.g., carrier output circuit 140, FIG. 1) is coupled between the output terminal 237 of the carrier amplifier die 236 (or more specifically, the drain terminal of a single-stage or final-stage power transistor within die 236) and the combining node lead 216, in an embodiment. The carrier output circuit 240 provides a conductive path between the carrier amplifier die 236 and the combining node 270, and that conductive path applies a desired phase delay to the amplified RF signal produced by the die 236 (e.g., a phase delay of $\theta_x$, as discussed previously). In addition, the carrier output circuit 240 functions as an output matching network between the carrier amplifier die 236 and the combining node 270. As depicted schematically above and to the right of the enlarged view of device 210, the carrier output circuit 240 also includes a hybrid pi-match network, in an embodiment.

More specifically, in the embodiment illustrated in FIG. 2, the carrier output circuit 240 includes an inductance 243' in the form of a fourth set of wirebonds 243 coupled between the output terminal 237 of the carrier amplifier die 236 and the combining node lead 216, and a shunt-L circuit 281 (e.g., shunt-L circuit 181, FIG. 1) coupled between the output terminal 237 and a ground reference. The inductance 243' essentially is an "inductive path" between the output terminal 237 and lead 216. The shunt-L circuit 281 includes inductance 242' (e.g., inductance 142, FIG. 1) in the form of wirebonds 242 and the inductance of lead 215 and trace 282, which is coupled in series with RF decoupling capacitance 283' (e.g., capacitor 183, FIG. 1) in the form of a surface-mount capacitor 283 coupled between trace 282 and a ground reference trace 208. The inductance 242' and capacitance 283' have inductance and capacitance values, respectively, that configure the series combination of inductance 242' and capacitance 283' as a shunt-L circuit 281. Essentially, the shunt-L circuit 281 forms a portion of the output circuit 240, and the shunt-L circuit 281 is configured to compensate for (e.g., at least partially resonate out) the drain-source capacitances (e.g., capacitances 139, 159, FIG. 1) at the outputs 237, 257 of the carrier and peaking amplifier dies 236, 256. One or more shunt baseband decoupling capacitors 284 (e.g., with two shown in FIGS. 2-4) also may be coupled between trace 282 and ground reference trace 208 in relatively close proximity to RF decoupling capacitor 283 in order to lower the baseband impedance.

Further, the carrier output circuit 240 also includes a shunt capacitance 246' in the form of a shunt capacitor 246 (e.g., shunt capacitor 146, FIG. 1) that is coupled to the combining node 270 (i.e., to the combining node lead 216), but is implemented externally to the packaged amplifier device 210. In the embodiment illustrated in FIG. 2, the shunt capacitor 246 is a surface mount device coupled to the mounting surface of the module substrate 201, with a first terminal coupled to a conductive trace 271 to which the combining node lead 216 is connected, and with a second terminal coupled to a ground reference trace 208. In an alternate embodiment, the shunt capacitance provided by shunt capacitor 246 may be completely or partially implemented within device 210.

The peaking amplification path (e.g., path 150, FIG. 1) is electrically coupled between package lead 214 (referred to as the "peaking input lead") and the combining node lead 216. The peaking amplification path includes a peaking input matching network 254 (e.g., peaking IMN 154, FIG. 1), the peaking amplifier die 256, and a peaking output circuit 260 (e.g., peaking output circuit 160, FIG. 1). As depicted schematically below and to the left of the enlarged view of device 210, the peaking input matching network 254 includes a T-match network, in an embodiment, which includes first and second inductances 353', 355' in the physical form of fifth and sixth sets of wirebonds 353, 353 coupled in series between the peaking input lead 214 and the input terminal 255 of the peaking amplifier die 256 (or more specifically, the gate terminal of a pre-amplifier or single-stage power transistor within die 256). In addition, the peaking input matching network 254 includes a shunt capacitance 354', in the form of a capacitor 354 coupled to the top surface of flange 218. The capacitor 354 may be a surface mount device, in some embodiments, or the capacitor 354 may be a MIM capacitor integrated within an IPD, as illustrated in FIG. 2, in other embodiments. Either way, a first terminal of capacitor 354 is electrically coupled to a node between inductances 353', 355' (e.g. a bonding pad on the top surface of capacitor 354 to which wirebonds 353, 353 are connected), and a second terminal of capacitor 354 is electrically coupled to a ground reference (e.g., to flange 218).

In the embodiment illustrated in FIG. 2, a harmonic termination circuit (e.g., circuit 163, FIG. 1) also is coupled between the peaking input lead 214 and the ground reference. As discussed in conjunction with FIG. 1, the harmonic termination circuit may include an inductance 351' (e.g., in the form of a seventh set of wirebonds 351) and a capacitor 352' (e.g., a surface mount capacitor or a MIM capacitor 352 within an IPD) coupled in series between the peaking input lead 214 and the ground reference. In an alternate embodiment, as described in conjunction with FIG. 1, the harmonic termination circuit may be included in the peaking output circuit 260 (e.g., harmonic termination circuit 163, FIG. 1).

The peaking output circuit 260 (e.g., peaking output circuit 160, FIG. 1) is coupled between the output terminal 257 of the peaking amplifier die 256 (or more specifically, the drain terminal of a single-stage or final-stage power transistor within die 256) and the combining node lead 216, in an embodiment. The peaking output circuit 260 provides a conductive path between the peaking amplifier die 256 and the combining node 270, and that conductive path applies a desired phase delay to the amplified RF signal produced by the die 256 (e.g., a phase delay of $\theta_p$, as discussed previously).

In addition, the peaking output circuit 260 functions as an output matching network between the peaking amplifier die 256 and the combining node 270. As depicted schematically below and to the right of the enlarged view of device 210, the peaking output circuit 240 includes a pi-match network, in an embodiment. More specifically, in the embodiment illustrated in FIG. 2, the peaking output circuit 260 includes first and second inductances 262', 265' in the physical form of eighth and ninth sets of wirebonds 262, 265 coupled in series between the output terminal 257 of the peaking amplifier die 256 (or more specifically, the drain terminal of a final-stage power transistor within die 256) and the combining node lead 216. The inductances 262', 265' essentially are an "inductive path" between the output terminal 257 and lead 216. In addition, the peaking output circuit 260 includes a shunt capacitance 266', in the form of a capacitor 266 coupled to the top surface of flange 218. The capacitor 266 may be a surface mount device, in some embodiments, or the capacitor 266 may be a MIM capacitor integrated within an IPD, as illustrated in FIG. 2, in other embodiments. Either way, a first terminal of capacitor 266 is electrically coupled to a node between inductances 262', 265' (e.g. a bonding pad on the top surface of capacitor 266 to which wirebonds 262, 265 are connected), and a second terminal of capacitor 266 is electrically coupled to a ground reference (e.g., to flange 218).

Further, to implement an output matching network with a pi-match network configuration, the peaking output circuit 260 also includes a shunt capacitance 269' in the form of a shunt capacitor 269 (e.g., shunt capacitor 169, FIG. 1) that is coupled to the combining node 270 (i.e., to the combining node lead 216), but is implemented externally to the packaged amplifier device 210. In the embodiment illustrated in FIG. 2, the shunt capacitor 269 is a surface mount device coupled to the mounting surface of the module substrate 201, with a first terminal coupled to the conductive trace 271 to which the combining node lead 216 is connected, and with a second terminal coupled to a ground reference trace 208. In an alternate embodiment, the shunt capacitance provided by shunt capacitor 269 may be completely or partially implemented within device 210. It should be noted that, although capacitors 246 and 269 are illustrated in FIG. 2 as being separate, discrete, surface-mounted devices, the equivalent capacitance provided by capacitors 246, 269 could be provided, instead, by a single discrete capacitor.

According to an embodiment, an electromagnetic shielding structure is included within device 210, which is configured to shunt electromagnetic energy produced along the carrier and peaking amplification paths. In the embodiment of FIG. 2, the electromagnetic shielding structure includes a plurality of wirebonds 360, which have proximal ends coupled to lead 213, distal ends (i.e., the ends opposite the proximal ends) that are coupled to the flange 218, and a plurality of tack points (e.g., tack point 361), each coupled to the flange 218, along each wirebond 360 between the proximal and distal ends. As seen from a side view (not illustrated), the wirebonds 360 form a wirebond "fence", in that each wirebond has a plurality of series-coupled wirebond humps, with each hump being tacked to the flange 218 by adjacent tack points 316 and extending upward in a perpendicular direction from the surface of the flange 218. The heights of the wirebond humps may be higher than the dies 236, 256 and at least some of the wirebonds 243, 262, 265, 332, 333, 335, 351, 353, 355, so that the wirebond humps extend into the area through which electromagnetic energy emitted by either the carrier or peaking paths will be intersected. Because the wirebonds 360 are coupled to a ground reference through lead 213 and ground reference trace 208, the electromagnetic energy impinging on the wirebonds 360 may be shunted to ground. Accordingly, the electromagnetic shielding structure may reduce performance degradation, during operation, due to undesirable electromagnetic energy being conveyed from the carrier path to the peaking path, or vice versa.

On the output side of device 210, the combining node lead 216 is connected to an output circuit that includes trace 271, DC blocking capacitor 275 (e.g., DC blocking capacitor 175, FIG. 1), output transmission line 276 (e.g., transmission line 176, FIG. 1), and the output connector 290 (e.g., corresponding to RF output 190, FIG. 1). As discussed previously, according to an embodiment, an impedance at the combining node lead 216 (or an input impedance of the transmission line 276) is about equal to an input impedance of a load (e.g., antenna 106, FIG. 1), which ultimately will be coupled to the output connector 290. In some cases, one or more intervening circuit elements (e.g., a circulator) also may be coupled between the output connector 290 and the load. In a specific embodiment, the combining node lead 216 is at about a 50 ohm real impedance plane, although the impedance at the combining node lead 216 could be lower or higher, as well.

Again, unlike conventional Doherty amplifier implementations, no impedance transformer is included between the combining node lead 216 and the output connector 290, according to an embodiment. In an alternate embodiment, the impedance at the combining node lead 216 is not equal to the input impedance of the load, and the output transmission line 276 may be configured as an impedance transformer (or matching network), which transforms the impedance at output connector 290 to the impedance at combining node lead 216.

Also on the output side of device 210, a drain bias circuit 280 (e.g., DC bias circuit 180, FIG. 1) is provided partially within device 210 and partially on the module substrate 201 to enable drain bias voltages to be provided to the outputs (e.g., drain terminals) of the final-stage power transistors of the carrier and peaking amplifier dies 236, 256. To provide the drain bias voltages, the drain bias circuit 280 may be connected through conductive pad 289 to an external DC voltage source, which is configured to provide the desired drain bias voltages.

Within device 210, bias circuit 280 includes a first inductance (e.g., inductance 142, FIG. 1) in the form of a set of wirebonds 242 coupled between the output terminal 236 of carrier amplifier die 236 and lead 215. On the module substrate 201, bias circuit 280 also includes a trivial amount of inductance of conductive trace 282 to which lead 215 is connected, a shunt DC blocking capacitor 283 (e.g., DC blocking capacitor 183, FIG. 1) coupled between trace 282 and a ground reference trace 208, transmission lines 286 and 288, and the pad 289 (e.g., terminal 189, FIG. 1).

The output terminal 237 of carrier amplifier die 236 (and thus the drain of the final-stage transistor within die 236) receives the DC bias voltage, Vdd, through pad 289, transmission lines 288 and 286, trace 282, lead 215, and wirebonds 242. The output terminal 257 of peaking amplifier die 256 (and thus the drain of the final-stage transistor within die 256) receives the DC bias voltage, Vdd, through pad 289, transmission lines 288 and 286, trace 282, lead 215, wirebonds 242 and 243, lead 216, and wirebonds 265 and 262 in an embodiment. Accordingly, in the illustrated embodiment, the output terminals 237, 257 of both amplifier dies 236, 256 receive the output DC bias voltage, Vdd, through a single (common) DC voltage supply.

As explained above in conjunction with FIG. 1, DC bias circuit 280 also includes other circuitry, including a shunt-L circuit 281 (e.g., circuit 181, FIG. 1) and a low-impedance baseband termination circuit 285 (e.g., circuit 185, FIG. 1). The shunt-L circuit 281 was described above in conjunction with the description of the carrier output circuit 240.

The baseband termination circuit 285 is coupled to trace 282 and lead 215 (e.g., corresponding to node 182, FIG. 1). The baseband termination circuit 285 includes an effective inductance provided by transmission line 286 (e.g., transmission line 186, FIG. 1), and a shunt capacitor 287 (e.g., capacitor 187, FIG. 1), in an embodiment. Transmission line 286 has a first end coupled to trace 282 and lead 215, and a second end coupled to an intermediate node between transmission lines 286 and 288. Shunt capacitor 287 is coupled to the intermediate node between transmission lines 286, 288 and a ground reference trace 208.

As explained previously, the baseband termination circuit 285 is configured to improve the LFR of amplifier module 200 caused by the interaction between various circuitry and structures of the amplifier module 200 by presenting a low impedance at envelope frequencies and/or a high impedance at RF frequencies. The transmission line 286 and the capacitor 283 are configured or selected to have a specific effective inductance and capacitance values, respectively, so that trace 282 and lead 215 have a low impedance at baseband frequencies and a high impedance to RF signal energy (e.g., to minimize leakage through circuit 285 of signal energy associated with RF signals at or near the center frequency of operation of the amplifier module 200). Accordingly, trace 282 and lead 215 essentially function as a virtual ground reference for signal energy at baseband frequencies (e.g., frequencies above DC and up to the lower edge of the frequency band of operation of the amplifier module 200). In other words, trace 282 and lead 215 correspond to an RF cold point node (e.g., node 182, FIG. 1).

Several modifications may be made to the amplifier module 200 of FIG. 2 to provide easier module tunability and/or increased integration. Two such modifications will now be described in conjunction with FIGS. 3 and 4. It should be noted that like reference numbers are used between FIGS. 2-4 to denote substantially similar or identical features. For the purpose of brevity, detailed descriptions of all of those substantially similar or identical features are not repeated below. Instead, the descriptions of any identically-numbered features are intended to be incorporated into the below descriptions of the Doherty amplifier modules 300, 400 of FIGS. 3 and 4.

Turning now to FIG. 3, a plurality of components of Doherty amplifier module 300 are coupled to and/or mounted on a mounting surface of a module substrate 201, such as a single-layer or multi-layer PCB, for example. Doherty amplifier module 300 includes an input RF connector 202 (e.g., RF input 102, FIG. 1), a power splitter 220 (e.g., power splitter 120, FIG. 1), a carrier input transmission line 232, a peaking input transmission line 252, a packaged amplifier device 310, an output transmission line 276 (e.g., transmission line 176, FIG. 1), gate bias circuits 228, 229, a drain bias circuit 280 (e.g., bias circuit 180, FIG. 1), and an RF output 290 (e.g., RF output 190, FIG. 1).

Although packaged amplifier device 310 has many similar features as packaged amplifier device 210 (FIG. 2), as indicated by identical reference numbers, device 310 has several differences, as will be explained below. As shown in the enlarged interior view of the packaged amplifier device 310 on the right side of FIG. 3, the packaged amplifier device 310 includes a carrier input matching network 234 (e.g., carrier IMN 134, FIG. 1), a peaking input matching network 254 (e.g., peaking IMN 154, FIG. 1), a carrier amplifier 236 (e.g., carrier amplifier 136, FIG. 1), a peaking amplifier 256 (e.g., peaking amplifier 156, FIG. 1), at least a portion of a carrier output circuit 240 (e.g., carrier output circuit 140, FIG. 1), at least a portion of a peaking output circuit 363 (e.g., peaking output circuit 160, FIG. 1), and a combining node 270 (e.g., combining node 170, FIG. 1).

The primary difference between device 310 and device 210 (FIG. 2) is in the way that the peaking output circuit 363 is implemented. In particular, in the device 210 of FIG. 2, the peaking output circuit 260 includes inductance 262', inductance 265', and shunt capacitance 266' in the form of wirebonds 262, wirebonds 265, and capacitor 266, respectively, each of which are implemented within the device 210. In contrast, in device 310, the shunt capacitance of the peaking output circuit 366 is moved outside the device 310, which increases the ease of tuning the peaking output circuit 363.

More specifically, in the embodiment illustrated in FIG. 3, the peaking output circuit 363 includes first and second inductances 362', 365' (e.g., inductances 162, 165, FIG. 1), shunt capacitance 366' (e.g., capacitance 166, FIG. 1), and shunt capacitance 269' (e.g., capacitance 169, FIG. 1). Inductances 362' and 365' have the physical form of two sets of wirebonds 362, 365 coupled in series between the output terminal 257 of the peaking amplifier die 256 (or more specifically, the drain terminal of a final-stage power transistor within die 256) and the combining node lead 216. One of the sets of wirebonds 362 is coupled between the output terminal 257 of the peaking amplifier die 256 and lead 217, and the other set of wirebonds 365 is coupled between lead 217 and lead 216. The inductances 362', 365' essentially are an "inductive path" between the output terminal 257 and lead 216.

Lead 216 is coupled to conductive trace 317 of the module substrate 201, which makes the node between the sets of wirebonds 362, 365 electrically accessible from outside the packaged device 310. In the embodiment of FIG. 3, shunt capacitance 366' (e.g., capacitance 166, FIG. 1) takes the form a surface mount capacitor 366 coupled to the mounting surface of the module substrate 201. More specifically, a first terminal of capacitor 366 is electrically coupled to conductive trace 317 (e.g., which corresponds to the node between inductances 362' and 365'), and a second terminal of capacitor 366 is coupled to a ground reference trace 208. By implementing the shunt capacitance 366' outside the device 310, the value of capacitance 366' may be easily changed by selecting a different surface mount capacitor. Thus, tunability of the peaking output circuit 363 is enhanced.

Whereas the embodiment of Doherty amplifier module 300 in FIG. 3 may enhance tunability, other embodiments may reflect increased integration, which may be another desirable characteristic of a Doherty amplifier module.

Turning now to FIG. 4, for example, a plurality of components of Doherty amplifier module 400 once again are coupled to and/or mounted on a mounting surface of a module substrate 201, such as a single-layer or multi-layer PCB, for example. Doherty amplifier module 400 includes an input RF connector 202 (e.g., RF input 102, FIG. 1), a power splitter 220 (e.g., power splitter 120, FIG. 1), a carrier input transmission line 232, a peaking input transmission line 252, a packaged amplifier device 410, an output transmission line 276 (e.g., transmission line 176, FIG. 1), gate bias circuits 228, 229, a drain bias circuit 480 (e.g., bias circuit 180, FIG. 1), and an RF output 290 (e.g., RF output 190, FIG. 1).

Although packaged amplifier device 410 has many similar features as packaged amplifier device 210 (FIG. 2), as indicated by identical reference numbers, device 410 has several differences, as will be explained below. As shown in the enlarged interior view of the packaged amplifier device 410 on the right side of FIG. 4, the packaged amplifier device 410 includes a carrier input matching network 234 (e.g., carrier IMN 134, FIG. 1), a peaking input matching network 254 (e.g., peaking IMN 154, FIG. 1), a carrier amplifier 236 (e.g., carrier amplifier 136, FIG. 1), a peaking amplifier 256 (e.g., peaking amplifier 156, FIG. 1), at least a portion of a carrier output circuit 440 (e.g., carrier output circuit 140, FIG. 1), at least a portion of a peaking output circuit 260 (e.g., peaking output circuit 160, FIG. 1), and a combining node 270 (e.g., combining node 170, FIG. 1).

The primary difference between device 410 and device 210 (FIG. 2) is in the way that the carrier output circuit 440 is implemented. First, the similarities between carrier output circuit 240 (FIG. 2) and carrier output circuit 440 (FIG. 4) will be discussed. More specifically, in both the embodiments illustrated in FIGS. 2 and 4, the carrier output circuit 240, 440 includes an inductance 243' in the form of a set of wirebonds 243 coupled between the output terminal 237 of the carrier amplifier die 236 and the combining node lead 216, and a shunt capacitance 246' in the form of a shunt capacitor 246 (e.g., shunt capacitor 146, FIG. 1) that is coupled to the combining node 270 (i.e., to the combining node lead 216), but is implemented externally to the packaged amplifier device 210.

As to the differences between carrier output circuits 240, 440, circuit 240 includes a shunt-L circuit 281 (e.g., shunt-L circuit 181, FIG. 1) implemented partially-inside and partially-outside of the package 210, whereas circuit 440 includes a shunt-L circuit 481 implemented entirely inside the package 410. More specifically, the shunt-L circuit 481 includes inductance 442' (e.g., inductance 142, FIG. 1) in the form of wirebonds 442 coupled between the output terminal 237 of the carrier amplifier die 236 and a bondpad 482 at the top surface of IPD 490, which is coupled to the flange 218. In addition, the shunt-L circuit 481 includes a capacitance 483' (e.g., capacitor 183, FIG. 1), which takes the form of a capacitor (e.g., a MIM capacitor) implemented within IPD 490, and includes a first terminal coupled to bondpad 482, and a second terminal coupled to a ground reference (e.g., flange 218). Accordingly, the inductance 442' and the capacitance 483' are coupled in series between the output terminal 237 of the carrier amplifier die 236 and the ground reference. The inductance 442' and capacitance 483' have inductance and capacitance values, respectively, that configure the shunt-L circuit 281 to compensate for (e.g., at least partially resonate out) the drain-source capacitance (e.g., capacitance 139, FIG. 1) at the output terminal 237 of the carrier amplifier die 236.

Another difference between amplifier module 200 and amplifier module 400 is that the baseband termination circuit 285 in module 200 is implemented outside of the package 210, whereas amplifier module 400 includes a baseband termination circuit 485 implemented entirely inside the package 410. According to an embodiment, baseband termination circuit 485 includes a series coupled inductance, resistance, and capacitance (in any order) coupled between bondpad 482 and the ground reference. Each of the inductance, resistance, and capacitance of the baseband termination circuit 485 is implemented within IPD 490, in an embodiment. Further, the component values for the series coupled inductance, resistance, and capacitance of the baseband termination circuit 485 are configured or selected to have a specific effective inductance, resistance, and capacitance values, respectively, so that bondpad 482 has a low impedance at baseband frequencies and a high impedance to RF signal energy. Accordingly, bondpad 482 functions as a RF cold point node (e.g., node 182, FIG. 1).

According to a further embodiment, the drain bias circuit 480 is electrically coupled to output terminal 237 through lead 215 and wirebonds 486, which in turn are coupled to bondpad 285 of the IPD 490. Accordingly, the drain bias circuit 480 includes wirebonds 486, lead 215, pad 282, transmission lines 286, 288, and pad 289. To provide the drain bias voltages, the drain bias circuit 480 may be connected through pad 289 to an external DC voltage source, which is configured to provide the desired drain bias voltages.

The above-described embodiments include practical, compact, cost-effective, mass-producible implementations of a high power Doherty amplifier architectures, which may utilize two symmetric, substantially symmetric or slightly asymmetric carrier and peaking devices together with a real combining load circuit. When compared with conventional, highly-asymmetric Doherty power amplifiers, the above-described Doherty amplifier embodiments may provide simplified power device design, reduced parasitic effects and ease of matching, and potentially higher gain and linearizable power added efficiency.

An embodiment of a radio frequency (RF) power amplifier includes a packaged amplifier device and a shunt-inductance circuit. The packaged amplifier device includes a component mounting substrate, a plurality of leads (including a first lead), first and second amplifier dies coupled to the component mounting substrate, a first output circuit, and a second output circuit. The first amplifier die includes a first power transistor with a first output terminal, and the first amplifier die is configured to amplify a first input RF signal to produce a first output RF signal at the first output terminal. The second amplifier die includes a second power transistor with a second output terminal, and the second amplifier die is configured to amplify a second input RF signal to produce a second output RF signal at the second output terminal. The first output circuit is coupled to the first output terminal, and includes a first inductive path connecting the first output terminal to the first lead. The second output circuit is coupled to the second output terminal, and includes a second inductive path connecting the second output terminal to the first lead. The first lead is a combining node lead configured to combine the first and second output RF signals to produce a third output RF signal. The shunt-inductance circuit is coupled between the first output terminal and a ground reference.

According to a further embodiment, the combining node lead has a 50 ohm impedance, and the power amplifier does not include an impedance transformer between the combining node lead and an RF output of the power amplifier.

According to other further embodiments, the packaged amplifier device is a no-leads device (e.g., a dual-flat or qual-flat no-leads device), the component mounting substrate includes a conductive flange, the component mounting substrate and the plurality of leads are encapsulated together in fixed spatial relationships as portions of the no-leads device, top surfaces of the component mounting substrate and the plurality of leads define a mounting surface of the no-leads device, and the component mounting substrate and the plurality of leads extend from the mounting surface to a bottom surface of the no-leads device.

According to another further embodiment, the first inductive path includes a first set of wirebonds connected between the first output terminal and the first lead. Further, the second output circuit further includes a first shunt capacitor having a first terminal and a second terminal, and the second inductive path includes a second set of wirebonds connected between the second output terminal and the first terminal of the first shunt capacitor, and a third set of wirebonds connected between the first terminal of the first shunt capacitor and the first lead.

According to another further embodiment, the RF power amplifier further includes a second substrate with a third output circuit that includes a first conductive trace and an RF output, where the first lead is coupled to the first conductive trace, and the first conductive trace is electrically coupled to the RF output, and the third RF output signal is conveyed from the first lead through the third output circuit to the RF output.

According to another further embodiment, the plurality of leads further includes a second lead, the second substrate further includes a second conductive trace and a ground reference trace, where the second lead is coupled to the second conductive trace, the second inductive path includes a second set of wirebonds connected between the second output terminal and the second lead, and a third set of wirebonds connected between the second lead and the first lead, and the RF power amplifier further includes a first shunt capacitor having a first terminal and a second terminal, where the first terminal is coupled to the second conductive trace, and the second terminal is coupled to the ground reference trace.

According to another further embodiment, the second substrate further includes a ground reference trace, the first output circuit further includes a first shunt capacitance coupled between the first conductive trace and the ground reference trace, and the second output circuit further includes a second shunt capacitance coupled between the first conductive trace and the ground reference trace.

According to another further embodiment, the third output circuit further includes a transmission line, and a DC blocking capacitor with a first terminal coupled to the first conductive trace, and a second terminal coupled to a first end of the transmission line. According to another further embodiment, the transmission line is a 50 ohm transmission line.

According to another further embodiment, the second substrate further includes a second conductive trace and a ground reference trace, and the plurality of leads includes a second lead coupled to the second conductive trace. In addition, the shunt-inductance circuit includes a shunt capacitor having a first terminal and a second terminal, where the first terminal is coupled to the second conductive trace, and the second terminal is coupled to the ground reference trace, and a third inductive path coupled to the first terminal of the shunt capacitor through the second lead.

According to another further embodiment, the third inductive path includes a first set of wirebonds coupled between the first output terminal and the second lead, the second lead, and the second conductive trace.

According to another further embodiment, the shunt-inductance circuit includes a shunt capacitor coupled to the component mounting substrate and having a first terminal and a second terminal, and a first set of wirebonds coupled between the first output terminal and the first terminal of the shunt capacitor.

According to another further embodiment, the plurality of leads further includes a second lead, and the RF power amplifier further comprises a second substrate and a bias circuit. The second substrate has a third output circuit that includes a first conductive trace and an RF output, where the first lead is coupled to the first conductive trace, and the first conductive trace is electrically coupled to the RF output. The bias circuit that includes a second set of wirebonds coupled between the first terminal of the shunt capacitor and the second lead, the second lead, and a second conductive trace on the second substrate, where the bias circuit is configured to convey DC bias voltages to the first output terminal of the first amplifier die through the first set of wirebonds, and to the second output terminal of the second amplifier die through the first inductive path, the combining node lead, and the second inductive path. According to another further embodiment, the RF power amplifier further includes a baseband termination circuit coupled between the first terminal of the shunt capacitor and a ground reference.

According to another further embodiment, the plurality of leads further includes a second lead, and the RF power amplifier further comprises a second substrate and a bias circuit. The second substrate has a third output circuit that includes a first conductive trace and an RF output, where the first lead is coupled to the first conductive trace, and the first conductive trace is electrically coupled to the RF output. The bias circuit that includes a set of wirebonds coupled between the first output terminal of the first amplifier die and the second lead, the second lead, and a second conductive trace on the second substrate, where the bias circuit is configured to convey DC bias voltages to the first output terminal of the first amplifier die through the second conductive trace, the second lead, and the set of wirebonds, and to the second output terminal of the second amplifier die through the first inductive path, the combining node lead, and the second inductive path. According to another further embodiment, the RF power amplifier further includes a baseband termination circuit that includes a portion of the second conductive trace and a shunt capacitor coupled between the second conductive trace and a ground reference trace on the second substrate.

According to another further embodiment, the RF power amplifier is a Doherty power amplifier, the first amplifier die is a carrier amplifier die, and the second amplifier die is a peaking amplifier die, and the Doherty power amplifier further includes a power splitter, a first input circuit, and a second input circuit. The power splitter is configured to receive an RF input signal from an RF input, and to divide the RF signal into the first input RF signal and the second input RF signal, where the first input RF signal is produced at a first output of the power splitter, and the second input RF signal is produced at a second output of the power splitter. the first input circuit is coupled between the first output of the power splitter and a first input terminal of the carrier amplifier die, and the second input circuit coupled between the second output of the power splitter and a second input terminal of the peaking amplifier die. According to another further embodiment, a carrier amplification path of the Doherty power amplifier is from the first output of the power splitter through the carrier amplifier die to the combining node lead, a peaking amplification path of the Doherty power amplifier is from the second output of the power splitter through the peaking amplifier die to the combining node lead, and a first electrical length of the carrier amplification path equals a second electrical length of the peaking amplification path at a center frequency of operation of the Doherty power amplifier.

An embodiment of a Doherty power amplifier includes a packaged amplifier device and a shunt-inductance circuit. The packaged amplifier device includes a component mounting substrate, a plurality of leads (including a first lead), a carrier amplifier die, a peaking amplifier die, a first output circuit, and a second output circuit. The carrier amplifier die is coupled to the component mounting substrate, and the carrier amplifier die includes a first power transistor with a first output terminal, and the carrier amplifier die is configured to amplify a first input RF signal to produce a first output RF signal at the first output terminal. The peaking amplifier die is coupled to the component mounting substrate, and the peaking amplifier die includes a second power transistor with a second output terminal, and the peaking amplifier die is configured to amplify a second input RF signal to produce a second output RF signal at the second output terminal. The first output circuit is coupled to the first output terminal, and the first output circuit includes a first inductive path connecting the first output terminal to the first lead. The second output circuit coupled to the second output terminal, and the second output circuit includes a second inductive path connecting the second output terminal to the first lead, where the first lead is a combining node lead configured to combine the first and second output RF signals to produce a third output RF signal. The shunt-inductance circuit is coupled between the first output terminal and a ground reference.

According to a further embodiment, the combining node lead has a 50 ohm impedance, and the Doherty power amplifier does not include an impedance transformer between the combining node lead and an RF output of the Doherty power amplifier.

According to another further embodiment, the Doherty power amplifier, further includes a second substrate with a third output circuit that includes a first conductive trace, a DC blocking capacitor, a transmission line, and an RF output coupled in series, where the first lead is coupled to the first conductive trace, and the third RF output signal is conveyed from the first lead through the output circuit to the RF output. According to another further embodiment, the transmission line is a 50 ohm transmission line.

According to another further embodiment, the Doherty power amplifier, further includes a power splitter, a first input circuit, and a second input circuit. The power splitter is configured to receive an RF input signal from an RF input, and to divide the RF signal into the first input RF signal and the second input RF signal, where the first input RF signal is produced at a first output of the power splitter, and the second input RF signal is produced at a second output of the power splitter. The first input circuit is coupled between the first output of the power splitter and a first input terminal of the carrier amplifier die, and the second input circuit is coupled between the second output of the power splitter and a second input terminal of the peaking amplifier die.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio frequency (RF) power amplifier comprising:
    a packaged amplifier device that includes
        a component mounting substrate,
        a plurality of leads, including a first lead,
        a first amplifier die coupled to the component mounting substrate, wherein the first amplifier die includes a first power transistor with a first output terminal, and the first amplifier die is configured to amplify a first input RF signal to produce a first output RF signal at the first output terminal,
        a second amplifier die coupled to the component mounting substrate, wherein the second amplifier die includes a second power transistor with a second output terminal, and the second amplifier die is configured to amplify a second input RF signal to produce a second output RF signal at the second output terminal,
        a first output circuit coupled to the first output terminal, wherein the first output circuit includes a first inductive path connecting the first output terminal to the first lead, wherein the first inductive path includes a first set of wirebonds connected between the first output terminal and the first lead,
        a second output circuit coupled to the second output terminal, wherein the second output circuit includes a second inductive path connecting the second output terminal to the first lead, wherein the first lead is a combining node lead configured to combine the first and second output RF signals to produce a third output RF signal, and wherein the second output circuit further includes a first shunt capacitor having a first terminal and a second terminal, and the second inductive path includes a second set of wirebonds connected between the second output terminal and the first terminal of the first shunt capacitor, and a third set of wirebonds connected between the first terminal of the first shunt capacitor and the first lead; and
    a shunt-inductance circuit coupled between the first output terminal and a ground reference.

2. The RF power amplifier of claim 1, wherein the combining node lead has a 50 ohm impedance, and the power amplifier does not include an impedance transformer between the combining node lead and an RF output of the power amplifier.

3. A radio frequency (RF) power amplifier comprising:
    a packaged amplifier device, which is a no-leads device that includes
        a component mounting substrate that includes a conductive flange, a plurality of leads, including a first lead, wherein the component mounting substrate and the plurality of leads are encapsulated together in fixed spatial relationships as portions of the no-leads device, top surfaces of the component mounting substrate and the plurality of leads define a mounting surface of the no-leads device, and the component mounting substrate and the plurality of leads extend from the mounting surface to a bottom surface of the no-leads device, a first amplifier die coupled to the component mounting substrate, wherein the first amplifier die includes a first power transistor with a first output terminal, and the first amplifier die is configured to amplify a first input RF signal to produce a first output RF signal at the first output terminal, a second amplifier die coupled to the component mounting substrate, wherein the second amplifier die includes a second power transistor with a second output terminal, and the second amplifier die is configured to amplify a second input RF signal to produce a second output RF signal at the second output terminal, a first output circuit coupled to the first output terminal, wherein the first output circuit includes a first inductive path connecting the first output terminal to the first lead, a second output circuit coupled to the second output terminal, wherein the second output circuit includes a second inductive path connecting the second output terminal to the first lead, wherein the first lead is a combining node lead configured to combine the first and second output RF signals to produce a third output RF signal; and a shunt-inductance circuit coupled between the first output terminal and a ground reference.

4. The RF power amplifier of claim 3, wherein the no-leads device is selected from a dual-flat no-leads device and a quad-flat no-leads device.

5. A radio frequency (RF) power amplifier comprising:
a packaged amplifier device that includes
a component mounting substrate,
a plurality of leads, including a first lead,
a first amplifier die coupled to the component mounting substrate, wherein the first amplifier die includes a first power transistor with a first output terminal, and the first amplifier die is configured to amplify a first input RF signal to produce a first output RF signal at the first output terminal,
a second amplifier die coupled to the component mounting substrate, wherein the second amplifier die includes a second power transistor with a second output terminal, and the second amplifier die is configured to amplify a second input RF signal to produce a second output RF signal at the second output terminal,
a first output circuit coupled to the first output terminal, wherein the first output circuit includes a first inductive path connecting the first output terminal to the first lead,
a second output circuit coupled to the second output terminal, wherein the second output circuit includes a second inductive path connecting the second output terminal to the first lead, wherein the first lead is a combining node lead configured to combine the first and second output RF signals to produce a third output RF signal;

a shunt-inductance circuit coupled between the first output terminal and a ground reference; and
a second substrate with a third output circuit that includes a first conductive trace and an RF output, wherein the first lead is coupled to the first conductive trace, and the first conductive trace is electrically coupled to the RF output, and the third RF output signal is conveyed from the first lead through the third output circuit to the RF output.

6. The RF power amplifier of claim 5, wherein:
the plurality of leads further includes a second lead;
the second substrate further includes a second conductive trace and a ground reference trace, wherein the second lead is coupled to the second conductive trace;
the second inductive path includes a second set of wirebonds connected between the second output terminal and the second lead, and a third set of wirebonds connected between the second lead and the first lead; and
the RF power amplifier further comprises
a first shunt capacitor having a first terminal and a second terminal, wherein the first terminal is coupled to the second conductive trace, and the second terminal is coupled to the ground reference trace.

7. The RF power amplifier of claim 5, wherein:
the second substrate further includes a ground reference trace;
the first output circuit further includes a first shunt capacitance coupled between the first conductive trace and the ground reference trace; and
the second output circuit further includes a second shunt capacitance coupled between the first conductive trace and the ground reference trace.

8. The RF power amplifier of claim 5, wherein the third output circuit further includes:
a transmission line; and
a DC blocking capacitor with a first terminal coupled to the first conductive trace, and a second terminal coupled to a first end of the transmission line.

9. The RF power amplifier of claim 8, wherein the transmission line is a 50 ohm transmission line.

10. The RF power amplifier of claim 5, wherein:
the second substrate further includes a second conductive trace and a ground reference trace;
the plurality of leads includes a second lead coupled to the second conductive trace; and
the shunt-inductance circuit includes
a shunt capacitor having a first terminal and a second terminal, wherein the first terminal is coupled to the second conductive trace, and the second terminal is coupled to the ground reference trace, and
a third inductive path coupled to the first terminal of the shunt capacitor through the second lead.

11. The RF power amplifier of claim 10, wherein the third inductive path comprises:
a first set of wirebonds coupled between the first output terminal and the second lead, the second lead, and the second conductive trace.

12. The RF power amplifier of claim 1, wherein the shunt-inductance circuit comprises:
a shunt capacitor coupled to the component mounting substrate and having a first terminal and a second terminal; and
a first set of wirebonds coupled between the first output terminal and the first terminal of the shunt capacitor.

13. The RF power amplifier of claim 12, wherein the plurality of leads further includes a second lead, and the RF power amplifier further comprises:
  a second substrate with a third output circuit that includes a first conductive trace and an RF output, wherein the first lead is coupled to the first conductive trace, and the first conductive trace is electrically coupled to the RF output; and
  a bias circuit that includes a second set of wirebonds coupled between the first terminal of the shunt capacitor and the second lead, the second lead, and a second conductive trace on the second substrate, wherein the bias circuit is configured to convey DC bias voltages to the first output terminal of the first amplifier die through the first set of wirebonds, and to the second output terminal of the second amplifier die through the first inductive path, the combining node lead, and the second inductive path.

14. The RF power amplifier of claim 13, further comprising:
  baseband termination circuit coupled between the first terminal of the shunt capacitor and a ground reference.

15. The RF power amplifier of claim 1, wherein the plurality of leads further includes a second lead, and the RF power amplifier further comprises:
  a second substrate with a third output circuit that includes a first conductive trace and an RF output, wherein the first lead is coupled to the first conductive trace, and the first conductive trace is electrically coupled to the RF output; and
  a bias circuit that includes a set of wirebonds coupled between the first output terminal of the first amplifier die and the second lead, the second lead, and a second conductive trace on the second substrate, wherein the bias circuit is configured to convey DC bias voltages to the first output terminal of the first amplifier die through the second conductive trace, the second lead, and the set of wirebonds, and to the second output terminal of the second amplifier die through the first inductive path, the combining node lead, and the second inductive path.

16. The RF power amplifier of claim 15, further comprising:
  a baseband termination circuit that includes a portion of the second conductive trace and a shunt capacitor coupled between the second conductive trace and a ground reference trace on the second substrate.

17. The RF power amplifier of claim 1, wherein:
  the RF power amplifier is a Doherty power amplifier, the first amplifier die is a carrier amplifier die, and the second amplifier die is a peaking amplifier die; and
  the Doherty power amplifier further includes
    a power splitter configured to receive an RF input signal from an RF input, and to divide the RF signal into the first input RF signal and the second input RF signal, wherein the first input RF signal is produced at a first output of the power splitter, and the second input RF signal is produced at a second output of the power splitter;
    a first input circuit coupled between the first output of the power splitter and a first input terminal of the carrier amplifier die; and
    a second input circuit coupled between the second output of the power splitter and a second input terminal of the peaking amplifier die.

18. The RF power amplifier of claim 17, wherein:
  a carrier amplification path of the Doherty power amplifier is from the first output of the power splitter through the carrier amplifier die to the combining node lead,
  a peaking amplification path of the Doherty power amplifier is from the second output of the power splitter through the peaking amplifier die to the combining node lead, and
  a first electrical length of the carrier amplification path equals a second electrical length of the peaking amplification path at a center frequency of operation of the Doherty power amplifier.

19. A Doherty power amplifier comprising:
  a packaged amplifier device that includes
    a component mounting substrate,
    a plurality of leads, including a first lead,
    a carrier amplifier die coupled to the component mounting substrate, wherein the carrier amplifier die includes a first power transistor with a first output terminal, and the carrier amplifier die is configured to amplify a first input RF signal to produce a first output RF signal at the first output terminal,
    a peaking amplifier die coupled to the component mounting substrate, wherein the peaking amplifier die includes a second power transistor with a second output terminal, and the peaking amplifier die is configured to amplify a second input RF signal to produce a second output RF signal at the second output terminal,
    a first output circuit coupled to the first output terminal, wherein the first output circuit includes a first inductive path connecting the first output terminal to the first lead,
    a second output circuit coupled to the second output terminal, wherein the second output circuit includes a second inductive path connecting the second output terminal to the first lead, wherein the first lead is a combining node lead configured to combine the first and second output RF signals to produce a third output RF signal;
  a shunt-inductance circuit coupled between the first output terminal and a ground reference; and
  a second substrate with a third output circuit that includes a first conductive trace, a DC blocking capacitor, a transmission line, and an RF output coupled in series, wherein the first lead is coupled to the first conductive trace, and the third RF output signal is conveyed from the first lead through the output circuit to the RF output.

20. The Doherty power amplifier of claim 19, wherein the combining node lead has a 50 ohm impedance, and the Doherty power amplifier does not include an impedance transformer between the combining node lead and an RF output of the Doherty power amplifier.

21. The Doherty power amplifier of claim 19, wherein the transmission line is a 50 ohm transmission line.

22. The Doherty power amplifier of claim 19, further comprising:
  a power splitter configured to receive an RF input signal from an RF input, and to divide the RF signal into the first input RF signal and the second input RF signal, wherein the first input RF signal is produced at a first output of the power splitter, and the second input RF signal is produced at a second output of the power splitter;
  a first input circuit coupled between the first output of the power splitter and a first input terminal of the carrier amplifier die; and a second input circuit coupled between the second output of the power splitter and a second input terminal of the peaking amplifier die.

\* \* \* \* \*